US012784863B2

(12) United States Patent
Hogyoku

(10) Patent No.: US 12,784,863 B2
(45) Date of Patent: Nov. 3, 2026

(54) TEST APPARATUS AND TEST METHOD

(71) Applicant: Kioxia Corporation, Tokyo (JP)

(72) Inventor: Michiru Hogyoku, Yokohama (JP)

(73) Assignee: Kioxia Corporation, Tokyo (JP)

( * ) Notice: Subject to any disclaimer, the term of this patent is extended or adjusted under 35 U.S.C. 154(b) by 106 days.

(21) Appl. No.: 18/814,460

(22) Filed: Aug. 23, 2024

(65) Prior Publication Data

US 2025/0095763 A1 Mar. 20, 2025

(30) Foreign Application Priority Data

Sep. 15, 2023 (JP) ................................ 2023-150343

(51) Int. Cl.
*G11C 16/04* (2006.01)
*G01R 31/317* (2006.01)
*G11C 29/50* (2006.01)

(52) U.S. Cl.
CPC .. *G11C 29/50004* (2013.01); *G01R 31/31724* (2013.01); *G11C 2029/5004* (2013.01)

(58) Field of Classification Search
CPC ...... G11C 29/50004; G11C 2029/5004; G01R 31/31724
See application file for complete search history.

(56) References Cited

U.S. PATENT DOCUMENTS 9,236,147 B1 * 1/2016 Bellorado ............ G11C 29/028
11,894,037 B2 * 2/2024 Grobis .................. G11C 11/161
2006/0200714 A1 * 9/2006 Kamano ................ G11C 29/56 714/718
2008/0205163 A1 8/2008 Park et al.
2014/0071765 A1 3/2014 Ishii

FOREIGN PATENT DOCUMENTS

JP 2008-210503 A 9/2008
JP 2014-53060 A 3/2014
JP 2022-136185 A 9/2022

OTHER PUBLICATIONS

Daewoong Kang, et al., "A New Approach for Trap Analysis of Vertical NANO Flash Cell using RTN Characteristics", IEEE Int. Electron Dev. Meeting, 2014, 4 pages.

(Continued)

*Primary Examiner* — Pho M Luu
(74) *Attorney, Agent, or Firm* — Oblon, McClelland, Maier & Neustadt, L.L.P.

(57) ABSTRACT

In a test apparatus, a controller obtains a threshold voltage of a memory cell by performing first processing on a read characteristic. The first processing is processing of, when a subthreshold region in the read characteristic is defined as a first region, focusing on a second region being a region of a read voltage larger than a maximum read voltage of the first region. The controller calculates a first slope in a first threshold characteristic indicating a relationship between a write voltage and the threshold voltage in the write processing, based on the threshold voltage obtained in the first processing. The controller subtracts the first slope from a slope in a predetermined threshold characteristic to obtain a first slope degradation component.

22 Claims, 20 Drawing Sheets

(56) References Cited

OTHER PUBLICATIONS

F. Schanovsky, et al., "A TCAD Compatible SONOS Trapping Layer Model for Accurate Programming Dynamics", IEEE Int. Memory Workshop, 2021, 4 pages.
D. Verreck, et al., "Understanding the ISPP Slope in Charge Trap Flash Memory and its Impact on 3-D NAND Scaling", IEEE Int. Electron Dev. Meeting, 2021, 4 pages.
Michiru Hogyoku, et al., "TCAD Simulation for Capture /Emission of Carriers by Traps in SiN: Trap-Assisted Tunneling Model Extended for Capture of Carriers Injected via Fowler-Nordheim Tunneling", Int. Conf. Solid State Dev. Mater., 2021, 2 pages.
Michiru Hogyoku, et al., "TCAD simulation for capture/emission of carriers by traps in SiN: trap-assisted tunneling model extended for capture of carriers injected via Fowler-Nordheim tunneling", Jpn. J. Appl. Phys. 61, SC1087, 2022, 11 pages.
D. Verreck, et al., "An inner gate as enabler for vertical pitch scaling in macaroni channel gate-all-around 3-D NAND flash memory", Solid-State Electron. 199, 108498, 2023, 3 pages.

* cited by examiner

TEST APPARATUS AND TEST METHOD

CROSS-REFERENCE TO RELATED APPLICATIONS

This application is based upon and claims the benefit of Japanese Patent Application No. 2023-150343, filed on Sep. 15, 2023; the entire contents of which are incorporated herein by reference.

FIELD

Embodiments described herein relate generally to a test apparatus and a test method.

BACKGROUND

A test apparatus that tests a semiconductor storage device including a memory cell may test read characteristics of the memory cell by performing write processing on the memory cell with an increasing write voltage. The test apparatus is desired to appropriately test the memory cell.

DETAILED DESCRIPTION

In general, according to one embodiment, there is provided a test apparatus including an interface unit and a controller. The interface unit acquires a read characteristic indicating a relationship between a read voltage of a memory cell and a logarithm of a cell current. The memory cell is subject to write processing in which a write operation and a verification operation are repeated with increasing write voltage. The controller obtains a threshold voltage of the memory cell by performing first processing on the read characteristic. The first processing is processing of, when a subthreshold region in the read characteristic is defined as a first region, focusing on a second region being a region of a read voltage larger than a maximum read voltage of the first region. The controller calculates a first slope in a first threshold characteristic indicating a relationship between a write voltage and the threshold voltage in the write processing, based on the threshold voltage obtained in the first processing. The controller subtracts the first slope from a slope in a predetermined threshold characteristic to obtain a first slope degradation component.

Exemplary embodiments of a test apparatus will be explained below in detail with reference to the accompanying drawings. The present invention is not limited to the following embodiments.

Embodiments

The test apparatus according to the embodiment is a test apparatus for testing a semiconductor storage device including a memory cell, and performs write processing on the memory cell with an increasing write voltage to test a read characteristic of the memory cell, with improved configurations for appropriately testing the memory cell.

Figure 1:
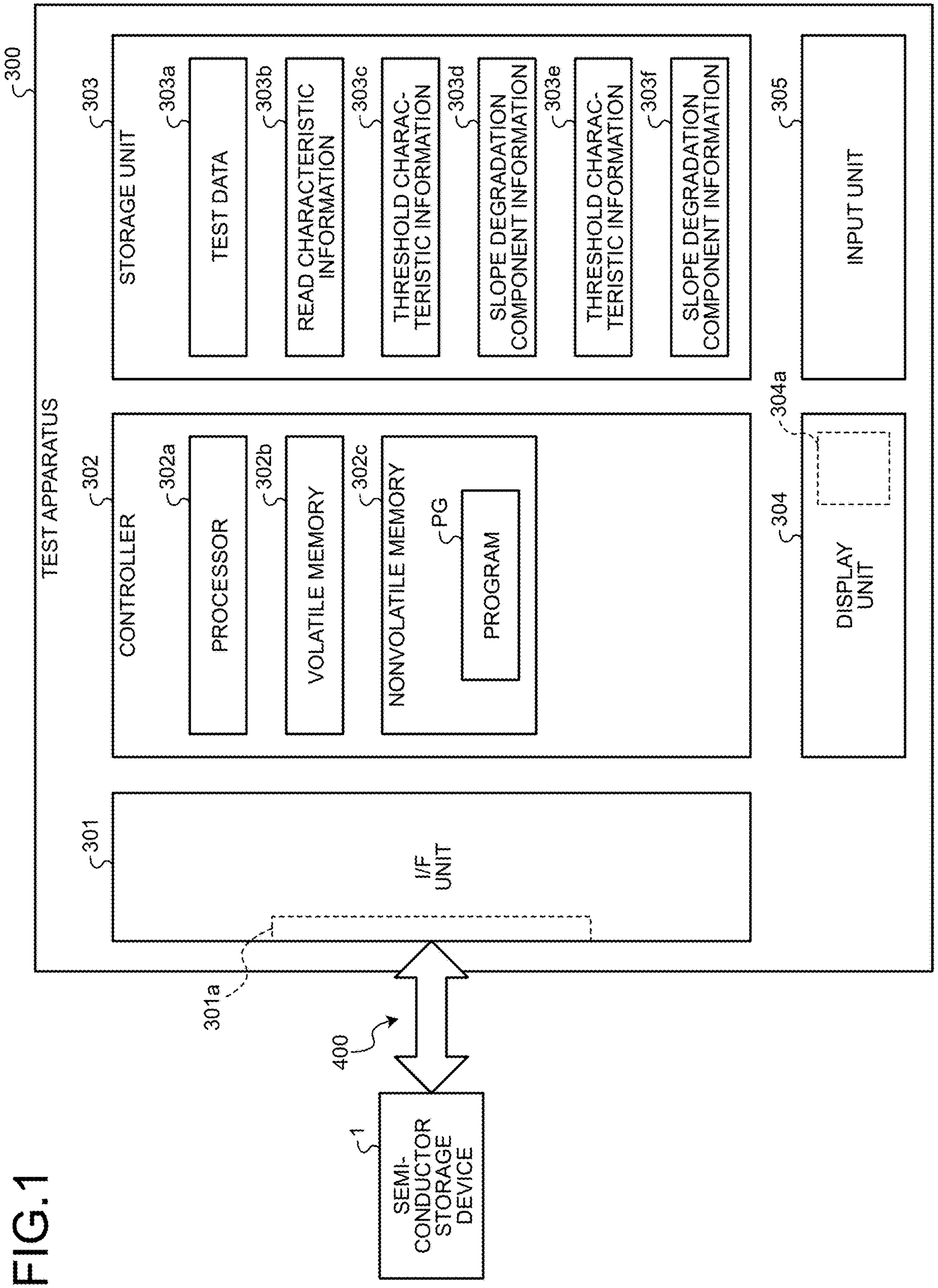
FIG. 1 is a block diagram illustrating a configuration of a test apparatus according to an embodiment.

A test apparatus 300 can be configured as illustrated in FIG. 1. FIG. 1 is a block diagram illustrating the configuration of the test apparatus 300.

The test apparatus 300 can be connected to a semiconductor storage device 1 via a communication medium 400. The communication medium 400 may include a wired communication channel such as a coaxial cable or a wireless communication channel. When connected to the semiconductor storage device 1, the test apparatus 300 can supply a test pattern to the semiconductor storage device 1 via the communication medium 400 to test the semiconductor storage device 1.

The test apparatus 300 includes an interface (I/F) unit 301, an input unit 305, a storage unit 303, a display unit 304, and a controller 302.

The interface unit 301 includes an external connection terminal 301*a*. The external connection terminal 301*a* can be connected to the semiconductor storage device 1 via the communication medium 400. The interface unit 301 performs an interface operation between the semiconductor storage device 1 and the controller 302 under the control of the controller 302.

The input unit 305 can receive an instruction from the user. For example, the input unit 305 may receive a test execution instruction related to a test of a memory cell. Having received an instruction from the user, the input unit 305 supplies the instruction to the controller 302. The input unit 305 may include a keyboard, a mouse, a touch panel, and the like.

The storage unit 303 stores predetermined information. The predetermined information includes information related to a test of the memory cell. The storage unit 303 may store test data 303*a*. The storage unit 303 may be a non-volatile storage medium such as a hard disk.

The display unit 304 includes a display screen 304*a*, and can display predetermined information on a display screen 304*a*. For example, the display unit 304 may display information related to a test of a memory cell (for example, test conditions, test results, and the like) on the display screen 304*a*.

The controller 302 integrally controls each unit of the test apparatus 300. The controller 302 may perform predetermined control in accordance with an instruction from the user, or may autonomously perform predetermined control in accordance with establishment of a predetermined condition.

For example, the controller 302 generates a write command in response to an instruction from the user via the input unit 305 or autonomously in accordance with establishment of a predetermined condition, and reads the test data 303*a* from the storage unit 303. The controller 302 supplies the write command and the test data 303*a* to the interface unit 301. The write command includes an address of a memory cell to be tested. The interface unit 301 converts the write command and the test data 303*a* into a format compatible with the communication medium 400 and supplies the converted command and data to the semiconductor storage device 1 via the communication medium 400.

The semiconductor storage device 1 includes multiple memory cells. Having received the write command and the test data, the semiconductor storage device 1 can perform test data write processing onto the memory cell addressed by the write command. The write processing may be performed by an Incremental Step Pulse Programming (ISPP) method. In the write processing, a write operation and a verification operation are repeated with an increasing write voltage. When the verification operation is successful to complete the write processing of the test data to the memory cell, the semiconductor storage device 1 transmits a write completion notification to the interface unit 301 via the communication medium 400.

Having received the write completion notification, the interface unit 301 supplies the write completion notification to the controller 302.

Thereafter, the controller 302 generates a read command in response to an instruction from the user via the input unit 305 or autonomously in accordance with establishment of a predetermined condition. The read command includes an address of a memory cell to be tested. The controller 302 may generate a read command including the address of the memory cell that has undergone write processing. The controller 302 supplies the read command to the interface unit 301.

Having received the read command, the semiconductor storage device 1 can perform read processing on the memory cell addressed by the read command. The read processing detects the cell current while sweeping the read voltage. Having completed the read processing on the memory cell, the semiconductor storage device 1 generates read characteristic information 303*b*. The read characteristic information 303*b* indicates a read characteristic. The read characteristic indicates a relationship between the read voltage and the logarithm (common logarithm) of the cell current. The semiconductor storage device 1 transmits the read characteristic information 303*b* to the interface unit 301 via the communication medium 400.

The interface unit 301 receives the read characteristic information 303*b*. Having acquired the read characteristic information 303*b*, the interface unit 301 supplies the read characteristic information 303*b* to the controller 302. The controller 302 stores the read characteristic information 303*b* in the storage unit 303.

The controller 302 performs processing PC1 on the read characteristic indicated by the read characteristic information 303*b* to obtain the threshold voltage of the memory cell. The processing PC1 is processing of obtaining the threshold voltage focusing on an overdrive region in the read characteristic. The processing PC1 includes processing of obtaining a voltage corresponding to a tangent near a boundary between the subthreshold region and the overdrive region in the read characteristic as the threshold voltage. The processing PC1 may include a process by a GM-MAX method (an extrapolation method using maximum transconductance).

In the present specification, the subthreshold region refers to a WL voltage region that linearly changes (that is, a region with a waveform of a straight line having a substantially constant inclination) in a chart in which a voltage of the word line WL (WL voltage: Vw1) is used as a horizontal axis and a common logarithm of the current flowing through the memory cell (cell current: Icell), that is, $\log_{10}$ (Icell) is plotted on a vertical axis. The overdrive region refers to a region having a WL voltage higher than the maximum WL voltage of the subthreshold region. Hereinafter, "logarithm" refers to a common logarithm.

The controller 302 generates threshold characteristic information 303*c* based on the threshold voltage obtained in the processing PC1. The threshold characteristic information 303*c* indicates a threshold characteristic TP1. The threshold characteristic TP1 indicates a relationship between the write voltage and the threshold voltage in the write processing. The controller 302 may obtain the threshold characteristic TP1 by performing plotting on a plane having the threshold voltage obtained in the processing PC1 and the write voltage during the write processing as coordinate axes so as to generate the threshold characteristic information 303*c*.

Here, an average rate of change of the threshold voltage with respect to the write voltage is referred to as a slope. A phenomenon in which the average rate of change of the threshold voltage with respect to the write voltage decays from a predetermined rate of change will be referred to as slope degradation. The predetermined rate of change may be a theoretically obtainable ideal rate of change, and is 1, for example.

The controller 302 calculates a slope SL1 in the threshold characteristic TP1. The slope SL1 indicates an average rate of change of the threshold voltage with respect to the write voltage in the threshold characteristic TP1. The controller 302 generates slope degradation component information 303*d* in accordance with the slope SL1. The slope degradation component information 303*d* indicates a slope degradation component ΔDS1. The controller 302 may obtain a threshold characteristic TP0 based on an ideal condition such as an ideal rate of change and may calculate a slope SL0 in a threshold characteristic TP0. The controller 302 may subtract the slope SL1 from the slope SL0 to obtain the slope degradation component ΔDS1. The controller 302 stores the slope degradation component information 303*d* in the storage unit 303.

The controller 302 performs processing PC2 on the read characteristic indicated by the read characteristic information 303*b* to obtain the threshold voltage of the memory cell. The processing PC2 is processing of obtaining the threshold voltage focusing on the subthreshold region in the read characteristic. The processing PC2 includes processing of obtaining a voltage corresponding to an approximate straight line of the subthreshold region in the read characteristic, as the threshold voltage.

The controller 302 generates threshold characteristic information 303*e* based on the threshold voltage obtained by the processing PC2. The threshold characteristic information 303*e* indicates a threshold characteristic TP2. The threshold characteristic TP2 indicates a relationship between the write voltage and the threshold voltage in the write processing. The controller 302 may obtain the threshold characteristic TP2 by plotting the threshold voltage obtained in the processing PC2 and the write voltage during the write processing so as to generate the threshold characteristic information 303*e*.

The controller 302 calculates a slope SL2 in the threshold characteristic TP2. The slope SL2 indicates the inclination of the change in the threshold voltage with respect to the write voltage. The controller 302 generates slope degradation component information 303*f* in accordance with the slope SL2. The slope degradation component information 303*f* indicates a slope degradation component ΔDS2. The controller 302 may subtract the slope SL2 from the slope SL1 to obtain the slope degradation component ΔDS2. The controller 302 stores the slope degradation component information 303*f* in the storage unit 303.

The controller 302 reads the slope degradation component information 303*d* and the slope degradation component information 303*f* individually from the storage unit 303. The controller 302 notifies the user of the slope degradation component ΔDS1 corresponding to the slope degradation component information 303*d* and the slope degradation component ΔDS2 corresponding to the slope degradation component information 303*f*. The controller 302 may display the slope degradation component ΔDS1 and the slope degradation component ΔDS2 on the display screen 304*a* of the display unit 304. The controller 302 may display the slope degradation component information 303*d* and the slope degradation component information 303*f* on the display screen 304*a* of the display unit 304 in a mode of being able to recognize the magnitude relationship between the slope degradation component ΔDS1 and the slope degradation component ΔDS2. This makes it possible for the test apparatus 300 to notify the user of the slope degradation component ΔDS1 and the slope degradation component ΔDS2. By comparing the slope degradation component ΔDS1 and the slope degradation component ΔDS2 when there is a failure in the memory cell, the cause of the failure can be predicted to some extent.

The slope degradation component ΔDS1 indicates degradation due to a decrease in carrier capture efficiency of the memory cell. The decrease in carrier capture efficiency is a phenomenon in which charges are less likely to be accumulated in a charge accumulation film together with thinning of a block insulating film of the memory cell in response to the demand for miniaturization. The decrease in the carrier capture efficiency is likely to increase the write voltage necessary for successful verification in the write processing of the memory cell, leading to a possibility of earlier degradation of the memory cell.

The slope degradation component ΔDS2 indicates degradation due to a fringe effect of the memory cell. The fringe effect is a phenomenon in which the shortened distance between memory cells in response to a demand for miniaturization causes the cell current to flow at a read voltage lower than an appropriate read voltage. Occurrence of the fringe effect tends to decrease the read voltage in the read processing of the memory cell, making it difficult to achieve a proper sense amplifier operation.

For example, in a case where the slope degradation component ΔDS1 is larger than the slope degradation component ΔDS2 when there is a failure in the memory cell, a main cause of the failure can be predicted to be a decrease in carrier capture efficiency of the memory cell. This makes it possible to prompt the user to take measures against a decrease in carrier capture efficiency of the memory cell.

In another case where the slope degradation component ΔDS2 is larger than the slope degradation component ΔDS1 when there is a failure in the memory cell, the main cause of the failure can be predicted to be the fringe effect of the memory cell. This makes it possible to prompt the user to take measures against the fringe effect of the memory cell.

Figure 2:
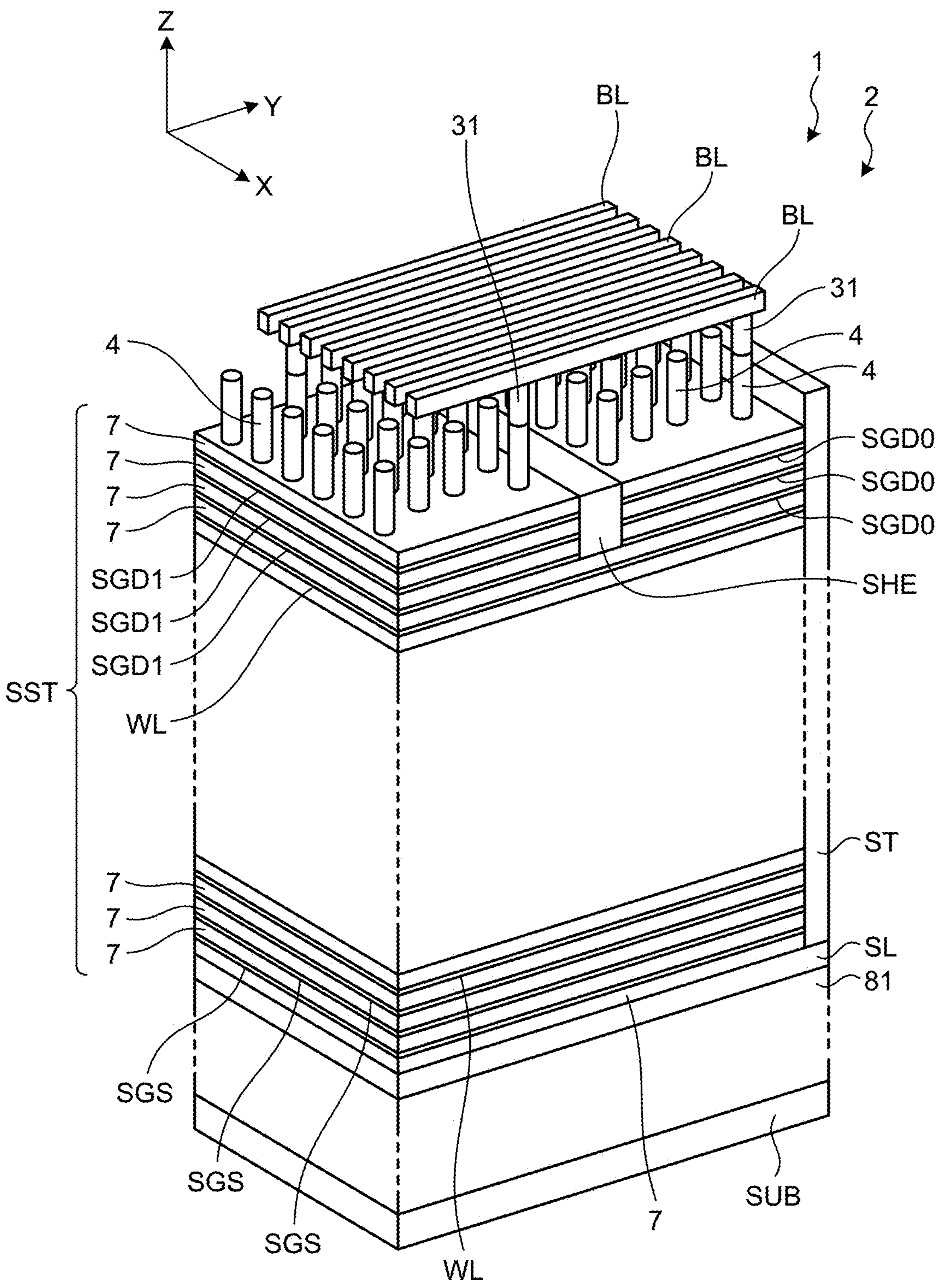
FIG. 2 is a perspective view illustrating a configuration of a semiconductor storage device to be tested in the embodiment.

Next, the semiconductor storage device 1 to be tested will be described. As illustrated in FIG. 2, the semiconductor storage device 1 has a three-dimensional structure. In this structure, a columnar semiconductor film penetrates a stacked body formed with multiple conductive layers stacked via an insulating layer, and a portion where each conductive layer and the semiconductor film are close to each other functions as a memory cell. FIG. 2 is a perspective view illustrating a configuration of the semiconductor storage device 1 to be tested. Hereinafter, an extending direction of the word line WL is referred to as an X direction, an extending direction of a bit line BL is referred to as a Y direction, and a direction orthogonal to the X direction and the Y direction is referred to as a Z direction.

As illustrated in FIG. 2, the semiconductor storage device 1 includes a select gate SGS, a word line WL, and a select gate SGD. The select gate SGS is stacked on a substrate SUB via an insulating layer 7. In the example of FIG. 2, the select gates SGS are provided as three layers. The word line WL is stacked on the uppermost select gate SGS via the insulating layer 7. In the example of FIG. 2, the word line WL is provided in plurality alternately with the insulating layer 7 in the Z direction. The select gate SGD is stacked on the uppermost word line WL via the insulating layer 7. The select gate SGS, the word line WL, and the select gate SGD have plate shapes each extending in the X direction and the Y direction.

In the example of FIG. 2, the select gate SGD, the word line WL, and the select gate SGS are divided and insulated in the Y direction by a slit ST. A source line SL is disposed on the +Z side of the substrate SUB via an interlayer insulating film 81. The slit ST is provided on the +Z side of the source line SL and extends in the X direction and the Z direction.

The select gate SGD is divided in the Y direction by a division film SHE, for example. The example of FIG. 2 illustrates select gates SGD0 and SGD1 divided from each other in the Y direction. The division film SHE is provided above (on the +Z side of) the word line WL and extends in the X direction and the Z direction. Accordingly, on the word line WL, the select gate SGD0 and the select gate SGD1 are aligned in the Y direction. In the example of FIG. 2, the select gates SGD0 and SGD1 are each provided as three layers.

An example of the substrate SUB is a silicon substrate. The select gate SGS, the word line WL, and the select gate SGD are metal layers containing tungsten (W), for example. The insulating layer 7 and the interlayer insulating film 81 are insulators containing silicon oxide, for example.

The semiconductor storage device 1 further includes multiple columnar bodies 4. The columnar body 4 penetrates the select gate SGS, the word line WL, and the select gate SGD and extends in the Z direction which is a stacking direction of these components. The semiconductor storage device 1 further includes multiple bit lines BL provided above the select gate SGD.

Each of the columnar bodies 4 is electrically connected to the bit line BL via a contact plug 31. For example, one of the columnar bodies 4 sharing the select gate SGD0 and one of the columnar bodies 4 sharing the select gate SGD1 are electrically connected to one bit line BL.

In FIG. 2, an interlayer insulating film provided between the select gate SGD and the bit line BL is omitted for simplification of illustration.

In the semiconductor storage device 1, the select gate SGD, the word line WL, and the select gate SGS are each formed with a conductive layer. On the +Z side of the source line SL, there is provided a stacked body SST in which conductive layers and the insulating layers 7 are alternately stacked. The stacked body SST is penetrated by the columnar bodies 4 to form an array of three-dimensional memory cells (memory cell array).

That is, the semiconductor storage device 1 has a configuration in which portions where the word line WL and the columnar body 4 intersect function as memory cells, and includes a memory cell array 2 having multiple memory cells three-dimensionally arranged. In addition, a portion where the select gate SGS intersects with the columnar body 4 functions as a source-side select gate, while a portion where the select gates SGD0 and SGD1 intersect with the columnar body 4 functions as a drain-side select gate. With an increased number of stacked word lines WL in the stacked body SST, the semiconductor storage device 1 can increase the storage capacity without using a finer patterning technology.

Figure 3:
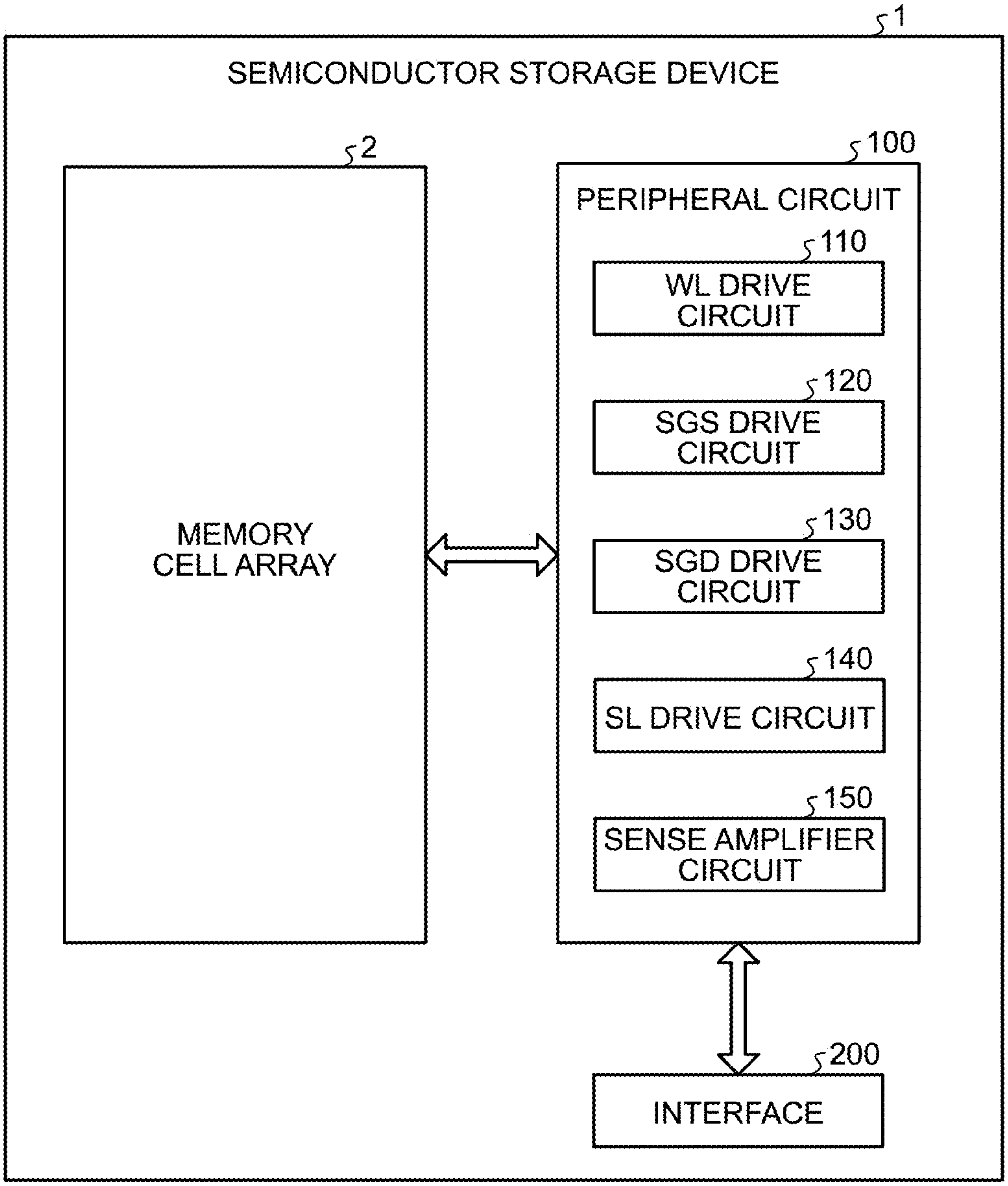
FIG. 3 is a block diagram illustrating a configuration of a semiconductor storage device to be tested in the embodiment.

FIG. 3 is a block diagram illustrating a schematic configuration of the semiconductor storage device 1.

As illustrated in FIG. 3, the semiconductor storage device 1 includes a memory cell array 2, a peripheral circuit 100, and an interface 200. The peripheral circuit 100 includes a WL drive circuit 110, an SGS drive circuit 120, an SGD drive circuit 130, an SL drive circuit 140, and a sense amplifier circuit 150.

The WL drive circuit 110 is a circuit that controls a voltage applied to the word line WL, and the SGS drive circuit 120 is a circuit that controls a voltage applied to the select gate SGS. The SGD drive circuit 130 is a circuit that controls a voltage applied to the select gate SGD, and the SL drive circuit 140 is a circuit that controls a voltage applied to the source line SL. The sense amplifier circuit 150 is a circuit that controls a voltage applied to the bit line BL and is a circuit that determines data read according to a signal from a selected memory cell.

The peripheral circuit 100 controls the operation of the semiconductor storage device 1 based on an instruction input from the outside (for example, a memory controller of a memory system to which the semiconductor storage device 1 is applied) via the interface 200.

Figure 4:
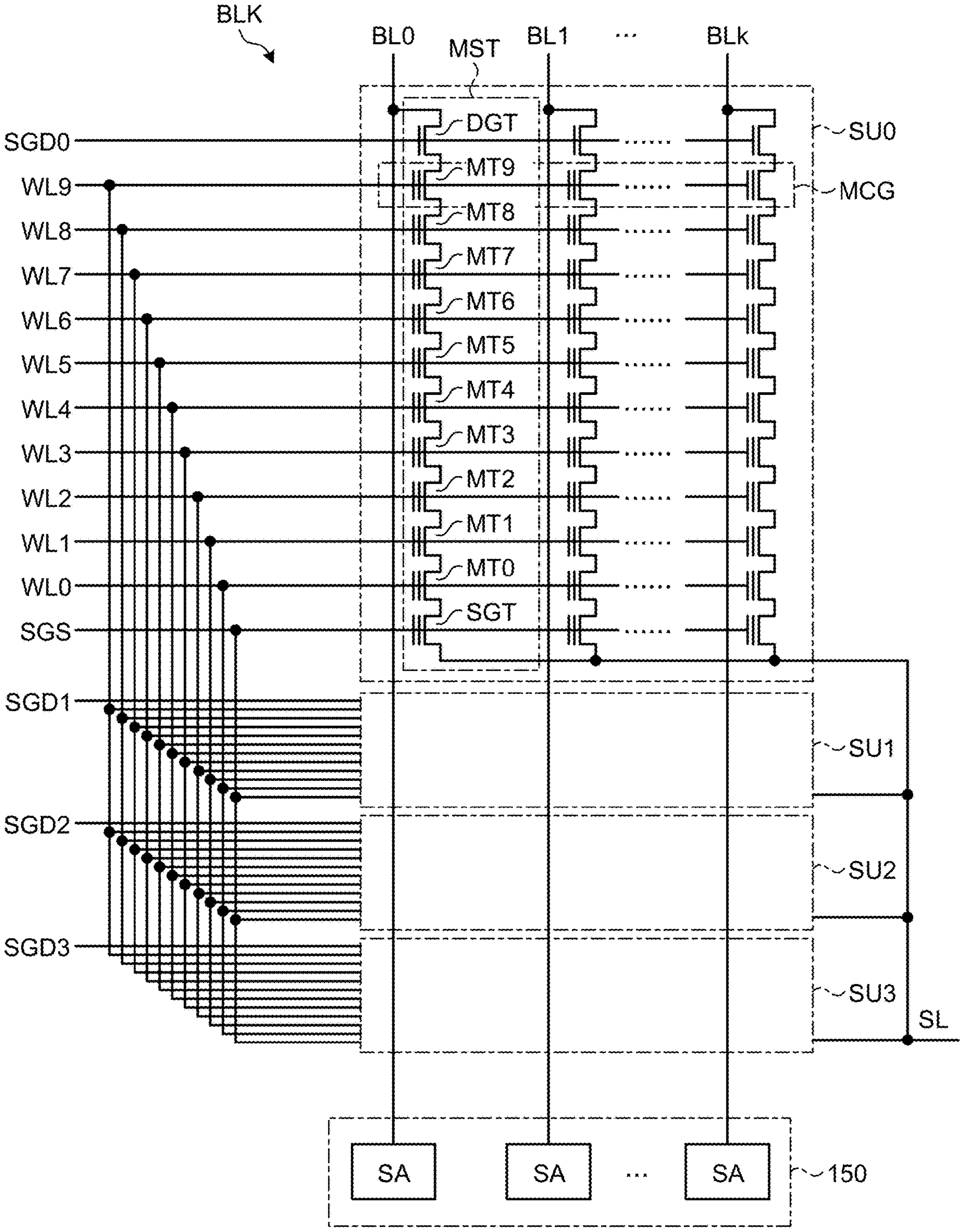
FIG. 4 is a circuit diagram illustrating a configuration of a memory cell array in the embodiment.

Next, a circuit configuration of the memory cell array 2 will be described with reference to FIG. 4. FIG. 4 is a circuit diagram illustrating a configuration of the memory cell array 2.

The memory cell array 2 includes multiple blocks BLK each of which is a set of multiple memory cell transistors MT. Hereinafter, the memory cell transistor MT is simply referred to as a memory cell MT.

Each block BLK includes multiple string units SU0, SU1, SU2, and SU3 each of which is a set of memory cells MT associated with the word line WL and the bit line BL. Each of the string units SU0 to SU3 includes multiple memory strings MST having the memory cells MT connected in series. Note that the number of memory strings MST in the string units SU0 to SU3 may be any number.

The multiple string units SU0, SU1, SU2, and SU3 correspond to the multiple select gates SGD0, SGD1, SGD2, and SGD3, respectively, share the select gate SGS, and function as multiple units of drive in the block BLK. Each string unit SU can be driven by its corresponding select gate SGD and select gate SGS. In addition, each of the string units SU includes multiple memory strings MST.

Each memory string MST includes, for example, ten memory cells MT (MT0 to MT9) and selection transistors DGT and SGT. The memory cell MT includes a control gate and a charge accumulation film, and performs nonvolatile retention and storage of data. The ten memory cells MT are connected in series between the source of the selection transistor DGT and the drain of the selection transistor SGT. The number of memory cell MT in the memory string MST is not limited to ten.

Gates of the selection transistors DGT in the string units SU0 to SU3 are connected to select gates SGD0 to SGD3, respectively. On the other hand, the gate of the selection transistor SGT in each string unit SU is commonly connected to the select gate SGS, for example.

The drains of the selection transistors DGT of the individual memory strings MST in the individual string units SU are connected to different bit lines BL0 to BLk (k is any integer of two or more). In addition, the bit lines BL0 to BLk commonly connect one memory string MST in each string unit SU among the multiple blocks BLK. Furthermore, the source of each selection transistor SGT is commonly connected to the source line SL.

That is, the string unit SU is a set of memory strings MST connected to different bit lines BL0 to BLk and connected to the identical select gate SGD. Each block BLK is a set of multiple string units SU0 to SU3 sharing the word line WL. The memory cell array 2 is a set of multiple blocks BLK sharing the bit lines BL0 to BLk.

The bit lines BL0 to BLk (denoted as BL when each bit line is not distinguished from each other) are connected to the memory string MST. When the select gate DGT is turned on, a channel region of each memory cell MT in the memory string MST can be electrically connected to the bit line BL. Each bit line BL is connected to a corresponding sense amplifier SA among the multiple sense amplifiers SAO to SAp in the sense amplifier circuit 150.

Word lines WL0 to WL9 (denoted as WL when each word line is not distinguished from each other) commonly connect the control gates of the memory cells MT among the individual memory strings MST in the individual string units SU in the physical block BLK. That is, the control gates of the memory cell MT in a same row in each string unit SU in the physical block BLK are connected to an identical word line WL. That is, the string unit SU of the physical block BLK includes multiple memory cell groups MCG corresponding to multiple word lines WL, and each memory cell group MCG includes (k+1) memory cells MT connected to the identical word line WL.

When each memory cell MT is configured to be able to retain a 1-bit value (when operating in a single-level cell (SLC) mode), (p+1) memory cells MT (that is, the memory group MCG) connected to the identical word line WL are handled as one physical page, and data write processing and data read processing are performed for each physical page.

For example, in a single-level cell (SLC) mode in which each memory cell MT stores a 1-bit value, data equivalent to one physical page is retained in each word line WL. Regarding the threshold distribution of the memory cells MT in the memory cell array 2, as illustrated in FIG. 5A to 5E, two states (small regions) ST0 to ST1 exist within a range (range of Vmin to Vmax) in which the threshold voltage is controlled. FIGS. 5A to 5E are diagrams illustrating threshold voltage distributions of the memory cells MT. Each state ST indicates a distribution of threshold voltages of the memory cells MT. Different 1-bit values are associated with each state ST. The states ST0 and ST1 can be associated with "1" and "0" respectively.

Each memory cell MT may be configured to be able to retain multiple bit values. When each memory cell MT can store a value of n (n≥2) bits, the storage capacity per word line WL is equal to the size of n physical pages. That is, each memory cell group MCG is handled as n physical pages.

Figure 5A:
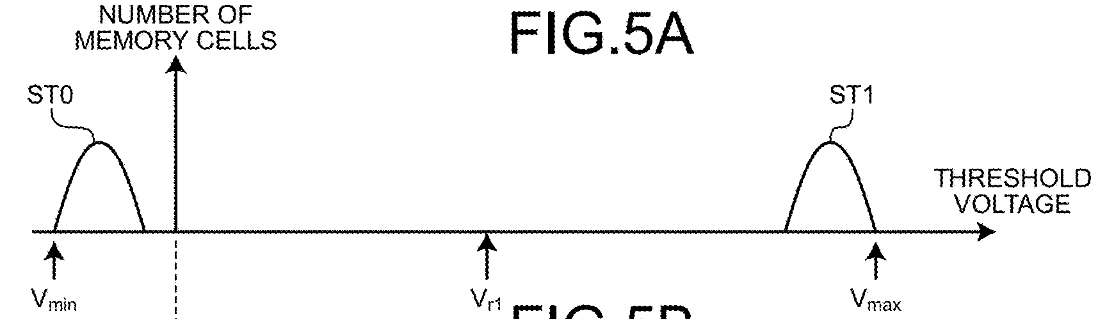
FIGS. 5A to 5E are diagrams illustrating threshold voltage distributions of memory cells in the embodiment.
Figure 5B:
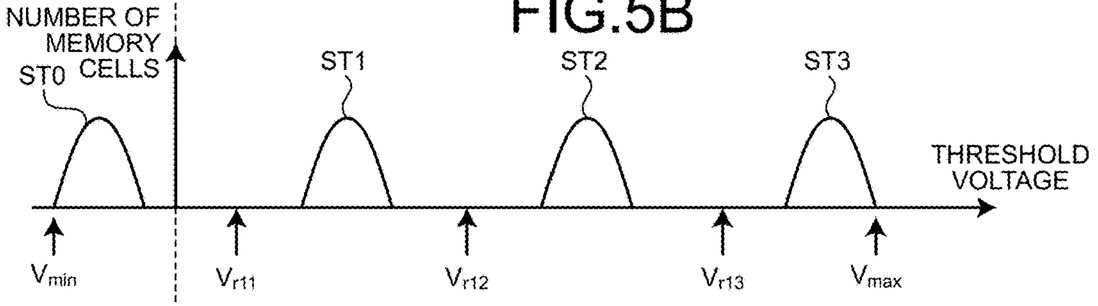

In a multi-level cell (MLC) mode in which each memory cell MT stores a 2-bit value, data of two physical pages is retained in each word line WL. Regarding the threshold distribution of the memory cells MT in the memory cell array 2, as illustrated in FIG. 5B, four states ST0 to ST3 exist within a range (range of Vmin to Vmax) in which the threshold voltage is controlled. Different 2-bit values are associated with each state ST. The states ST0, . . . , and ST3 can be associated with "11", . . . , and "00", respectively.

Figure 5C:
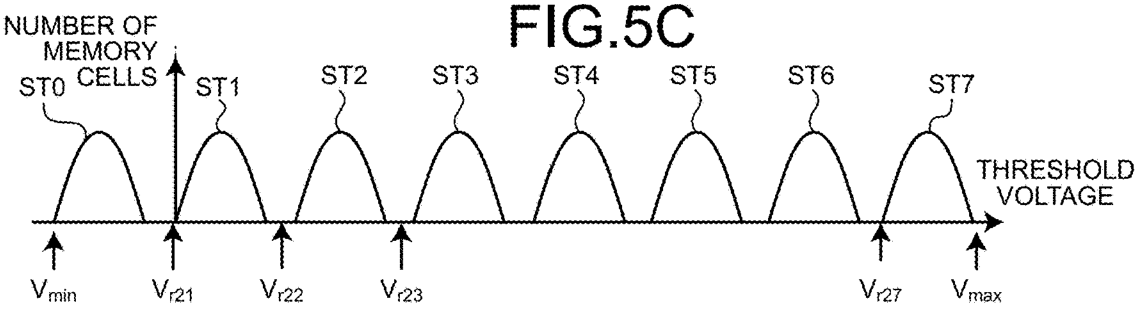

In a triple-level cell (TLC) mode in which each memory cell MT stores a 3-bit value, data of three physical pages is retained in each word line WL. Regarding the threshold distribution of the memory cells MT in the memory cell array 2, as illustrated in FIG. 5C, eight states ST0 to ST7 exist within a range (range of Vmin to Vmax) in which the threshold voltage is controlled. Different 3-bit values are associated with each state ST. The states ST0, . . . , and ST7 can be associated with "111", . . . , and "000", respectively.

Figure 5D:
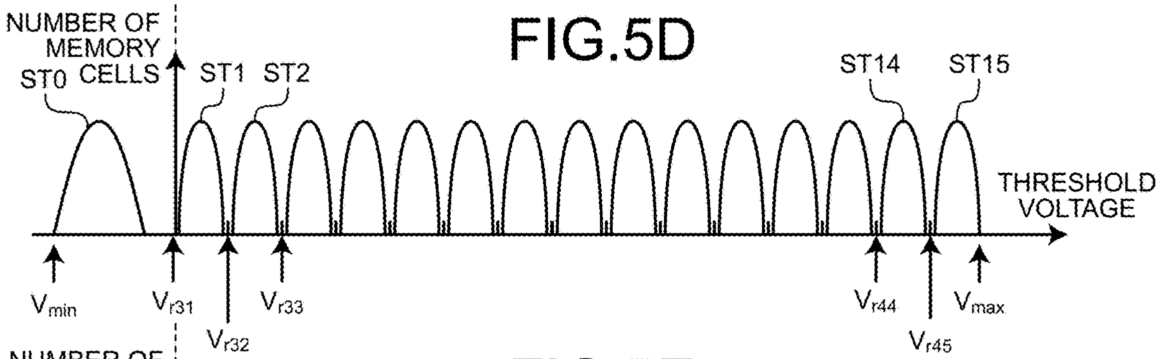

In a quad-level cell (QLC) mode in which each memory cell MT stores a 4-bit value, data of four physical pages is retained in each word line WL. Regarding the threshold distribution of the memory cells MT in the memory cell array 2, as illustrated in FIG. 5D, sixteen states ST0 to ST15 exist within a range (range of Vmin to Vmax) in which the threshold voltage is controlled. Different 4-bit values are associated with each state ST. The states ST0 and ST15 can be associated with "1111", . . . , and "0000" respectively.

Figure 5E:
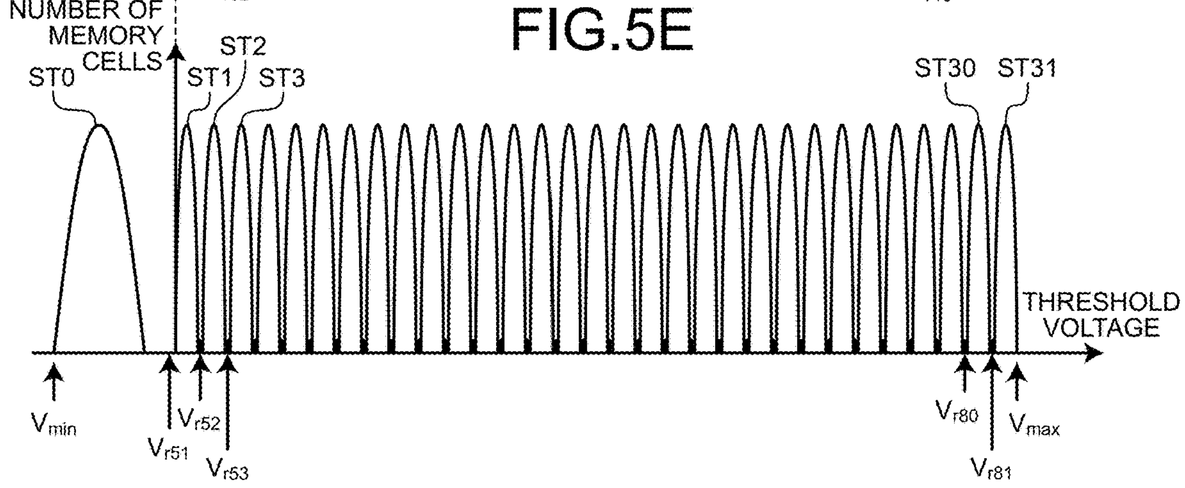

In a penta-level cell (PLC) mode in which each memory cell MT stores a 5-bit value, data of five physical pages is retained in each word line WL. Regarding the threshold distribution of the memory cells MT in the memory cell array 2, as illustrated in FIG. 5E, thirty-two states ST0 to ST31 exist within a range (range of Vmin to Vmax) in which the threshold voltage is controlled. Different 5-bit values are associated with each state ST. The states ST0, . . . , and ST31 can be associated with "11111", . . . , and "00000", respectively.

Figure 6:
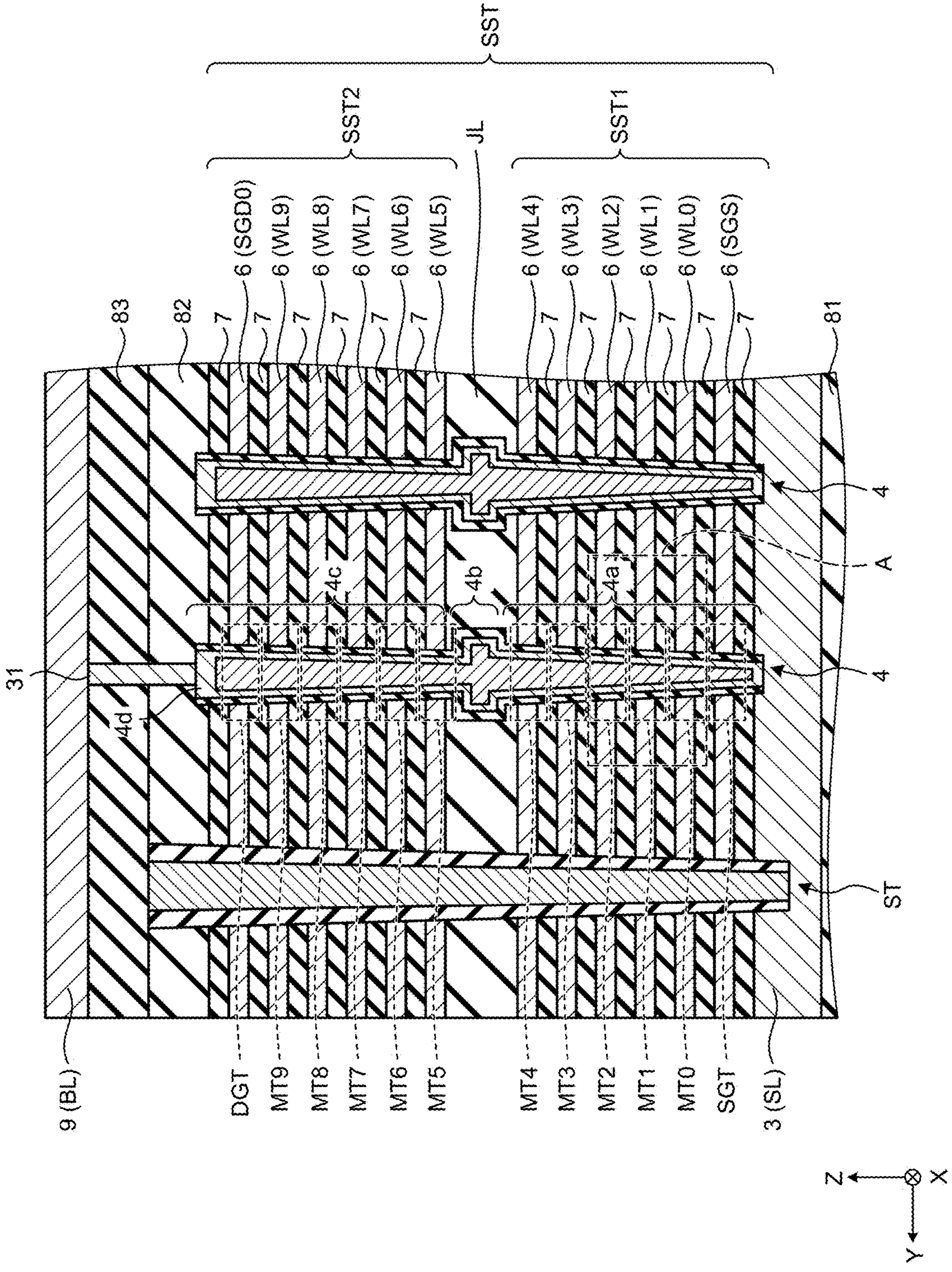
FIG. 6 is a cross-sectional view illustrating a configuration of the memory cell array in the embodiment.

Next, a cross-sectional configuration of the memory cell array 2 will be described with reference to FIG. 6. FIG. 6 is a cross-sectional view illustrating a configuration of the memory cell array 2.

In the semiconductor storage device 1, a conductive layer 3 is disposed on the +Z side of the substrate SUB via the interlayer insulating film 81. The conductive layer 3 can be formed with a material containing a semiconductor (for example, silicon) containing impurities as a main component or a material containing an electrical conductor (for example, a metal such as tungsten) as a main component. The conductive layer 3 extends in a plate shape in X-Y directions and functions as the source line SL (refer to FIG. 2). There is provided multiple columnar bodies 4 disposed on the +Z side of the conductive layer 3. The multiple columnar bodies 4 are arranged in the X-Y directions. Each columnar body 4 extends in the Z direction and penetrates the stacked body SST (refer to FIG. 2).

The stacked body SST has a structure including a stack of multiple stacked bodies SST1 and SST2. FIG. 6 illustrates a structure in which the stacked body SST is divided into the two stacked bodies SST1 and SST2, but the stacked body SST may be divided into three or more.

Each columnar body 4 has a tier 4*a*, a joint portion 4*b*, a tier 4*c*, and a cap layer 4*d* sequentially stacked on the +Z side of the conductive layer 3. The stacked body SST includes the stacked body SST1, a joint layer JL, and the stacked body SST2 sequentially stacked on the +Z side of the conductive layer 3.

Each of the stacked bodies SST1 and SST2 has a configuration in which the conductive layers 6 functioning as word lines WL and the like are stacked via the insulating layers 7. The tier 4*a* extends in the Z direction and penetrates the stacked body SST1. The joint portion 4*b* has a Z position corresponding to the joint layer JL. The joint layer JL can be formed with a material containing an oxide (for example, silicon oxide) as a main component. The tier 4*c* extends in the Z direction and penetrates the stacked body SST2. The +Z-side end portion of the tier 4*a* is coupled to the tier 4*c* via the joint portion 4*b*. The cap layer 4*d* extends in a plate shape in the X-Y directions and covers the +Z-side end of the tier 4*c*. The cap layer 4*d* can be formed with, for example, a material containing a semiconductor containing impurities (for example, polysilicon) as a main component. The conductive layer 9 is disposed on the +Z side of the stacked body SST2 via interlayer insulating films 82 and 83. The conductive layer 9 can be formed with a material containing an electrical conductor (for example, a metal such as tungsten) as a main component. The conductive layer 9 extends as a line in the Y direction and functions as the bit line BL (refer to FIG. 2). The cap layer 4*d* is connected to the bit line BL via the contact plug 31.

Figure 7A:
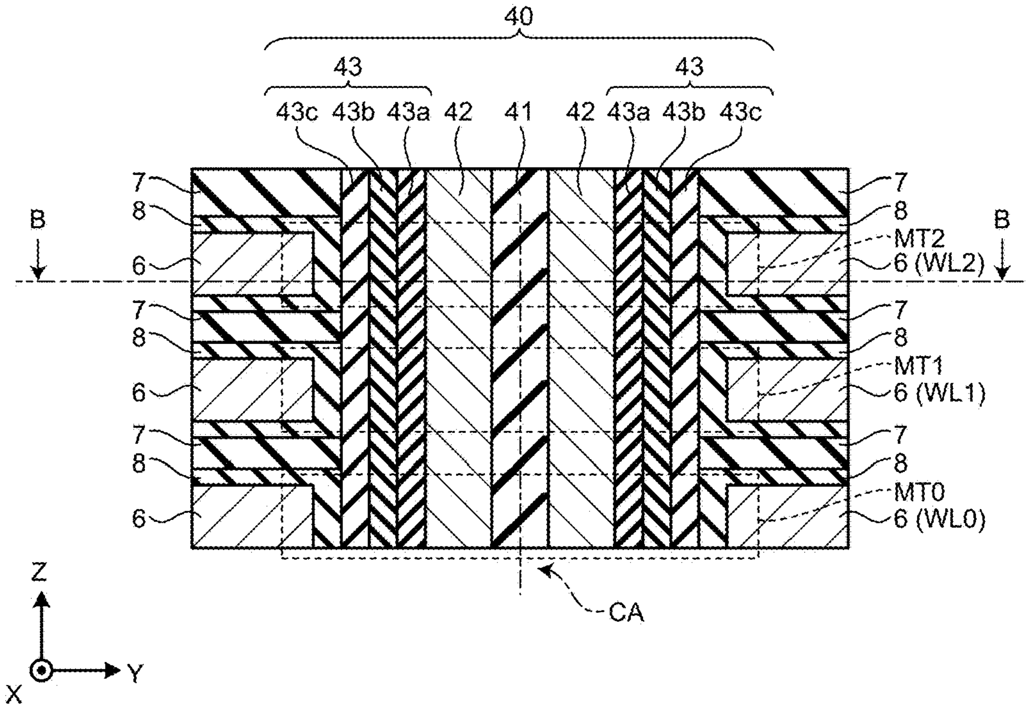
FIGS. 7A and 7B are cross-sectional views illustrating a configuration of the memory cell in the embodiment.
Figure 7B:
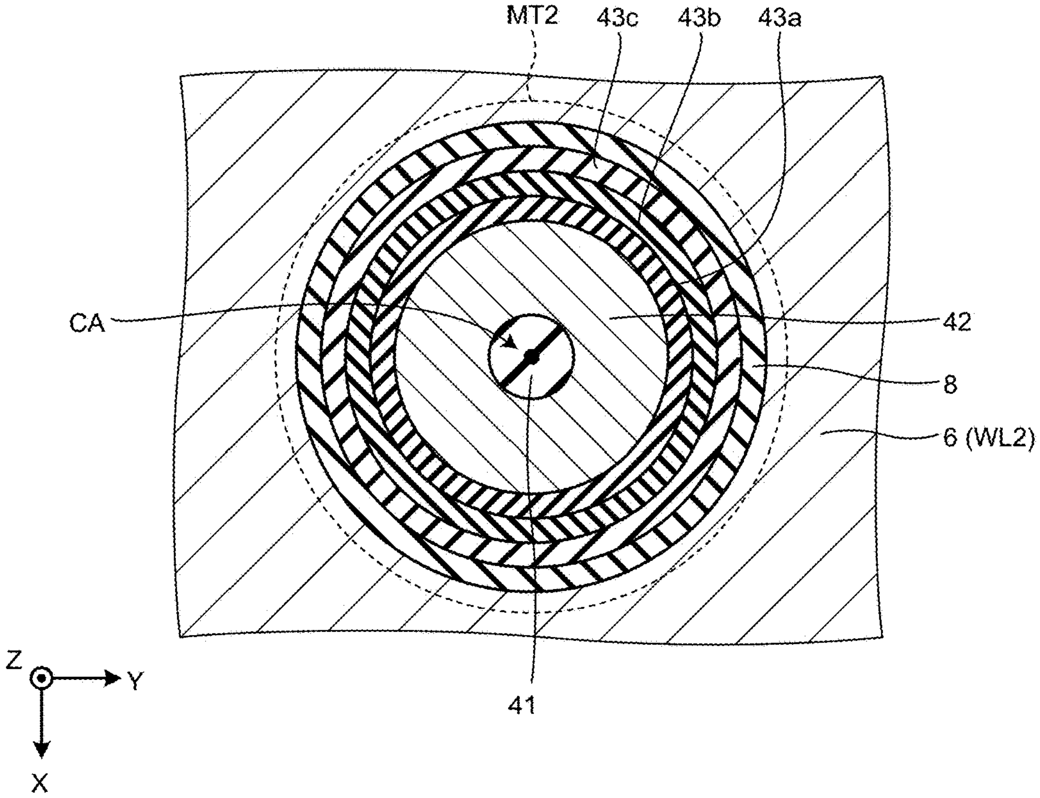

As illustrated in FIGS. 7A and 7B, the columnar body 40 includes a core member 41, a semiconductor film 42, and an insulating film 43 in this order from a central axis CA side. The insulating film 43 is a multilayer film including an insulating film 43*a*, a charge accumulation film 43*b*, and an insulating film 43*c* in this order from the central axis CA side. FIG. 7A is an YZ cross-sectional view illustrating the configuration of the memory cell, being an enlarged cross-sectional view of portion A in FIG. 6. FIG. 7B is an XY cross-sectional view illustrating the configuration of the memory cell, illustrating a cross section of FIG. 7A taken along line B-B.

The core member 41 has a substantially columnar pillar shape disposed in the vicinity of the central axis CA of the columnar body 40 and extending along the central axis CA of the columnar body 40. The core member 41 can be formed with a material containing an insulator (for example, a semiconductor oxide such as silicon oxide) as a main component.

The semiconductor film 42 is disposed so as to surround the core member 41 from the outside, and has a substantially cylindrical shape extending along the central axis CA of the columnar body 40. The semiconductor film 42 further covers the −Z-side end of the core member 41 and is connected to a conductive film 3. The semiconductor film 42 can be formed with a material containing a semiconductor (for example, polysilicon) substantially containing no impurities as a main component.

The insulating film 43*a* is disposed so as to surround the semiconductor film 42 from the outside and has a substantially cylindrical shape extending along the central axis CA of the columnar body 40. The insulating film 43*a* can be formed with a material containing an oxide (for example, silicon oxide or silicon oxynitride) as a main component.

The charge accumulation film 43*b* includes a substantially cylindrical shape that is disposed so as to surround the insulating film 43*a* from the outside and extends along the central axis CA of the columnar body 40. The charge accumulation film 43*b* can be formed with a material containing a nitride (for example, silicon nitride) as a main component.

The insulating film 43*c* is disposed so as to surround the charge accumulation film 43*b* from the outside, and has a substantially cylindrical shape extending along the central axis CA of the columnar body 40. The insulating film 43*c* can be formed with a material containing an oxide (for example, a silicon oxide, a metal oxide, or a stack of these) as a main component. This configuration can form an ONO three-layer structure in which the charge accumulation film 43*b* is sandwiched between the pair of insulating films 43*a* and 43*c*.

The insulating film 8 covers the insulating film 43*c* from the outside in the X-Y directions, extends to cover the +Z-side surface of the conductive layer 6, the surface on the columnar body 40 side, and the −Z-side surface of the conductive layer 6, and forms a substantially hollow disc shape having an axis in the Z direction. The insulating film 8 can be formed with an insulator such as aluminum oxide. Hereinafter, illustration and description of the insulating film 8 may be omitted for simplification.

The semiconductor film 42 of the columnar body 40 is connected, on the −Z side, to the conductive film 3 as the source line SL, while being connected, on the +Z side, to the conductive layer functioning as the bit line BL via the contact plug 31. That is, the semiconductor film 42 of the columnar body 40 includes a channel region (active region) in the memory string MST.

In each of the stacked bodies SST1 and SST2 illustrated in FIG. 6, the conductive layer 6 and the insulating layer 7 are alternately and repeatedly stacked. Each conductive layer 6 extends in a plate shape in the X-Y directions. Each conductive layer 6 can be formed with a material containing an electrical conductor (for example, a metal such as tungsten) as a main component. Regarding the surfaces of the conductive layers 6, the +Z-side surface, the −Z-side surface, and the surface facing the tiers 4*a* and 4*c* may be covered with the insulating film 8. The insulating film 8 may have a composition different from that of an insulator 43*c*. The insulating film 8 can be formed with a material containing an insulator (for example, metal oxides such as aluminum oxide, zirconium oxide, and hafnium oxide) as a main component. Each insulating layer 7 extends in a plate shape in the X-Y directions. Each insulating layer 7 can be formed with a material containing an insulator (for example, a semiconductor oxide such as silicon oxide) as a main component.

In the stacked body SST1, at least the conductive layer 6 closest to the −Z side among the multiple conductive layers 6 disposed apart from each other in the Z direction functions as the select gate SGS, and the other conductive layers 6 function as word lines WL0 to WL4.

The selection transistor SGT is formed at a position where the conductive layer 6 of the select gate SGS intersects the semiconductor film 42 and the charge accumulation film 43*b*. The memory cell MT0 is formed at a position where the conductive layer 6 of the word line WL0 intersects the semiconductor film 42 and the charge accumulation film 43*b*. The memory cell MT1 is formed at a position where the conductive layer 6 of the word line WL1 intersects the semiconductor film 42 and the charge accumulation film 43*b*. The memory cell MT2 is formed at a position where the conductive layer 6 of the word line WL2 intersects the semiconductor film 42 and the charge accumulation film 43*b*. The memory cell MT3 is formed at a position where the conductive layer 6 of the word line WL3 intersects the semiconductor film 42 and the charge accumulation film 43*b*. The memory cell MT4 is formed at a position where the conductive layer 6 of the word line WL4 intersects the semiconductor film 42 and the charge accumulation film 43*b*. Incidentally, the tier 4*a* may partially omit the charge accumulation film 43*b* and the insulating film 43*c* at a position intersecting the conductive layer 6 of the select gate SGS.

In the stacked body SST2 stacked on the stacked body SST1 via the joint layer JL, at least the conductive layer 6 closest to the +Z side among the multiple conductive layers 6 disposed apart from each other in the Z direction functions as the select gate SGD, and the other conductive layers 6 function as the word lines WL5 to WL9.

The memory cell MT5 is formed at a position where the conductive layer 6 of the word line WL5 intersects the semiconductor film 42 and the charge accumulation film 43*b*. The memory cell MT6 is formed at a position where the conductive layer 6 of the word line WL6 intersects the semiconductor film 42 and the charge accumulation film 43*b*. The memory cell MT7 is formed at a position where the conductive layer 6 of the word line WL7 intersects the semiconductor film 42 and the charge accumulation film 43*b*. The memory cell MT8 is formed at a position where the conductive layer 6 of the word line WL8 intersects the semiconductor film 42 and the charge accumulation film 43*b*. A memory cell MT9 is formed at a position where the conductive layer 6 of the word line WL9 intersects the semiconductor film 42 and the charge accumulation film 43*b*. The selection transistor DGT is formed at a position where the conductive layer 6 of the select gate SGD intersects the semiconductor film 42 and the charge accumulation film 43*b*. Incidentally, the tier 4*c* may partially omit the charge accumulation film 43*b* and the insulating film 43*c* at a position intersecting the conductive layer 6 of the select gate SGD.

In the processing of writing information to the memory cell MT, a write voltage is applied to the conductive layer 6 of the selected word line WL, a transfer voltage is applied to the conductive layer 6 of the unselected word line WL, and a reference voltage is applied to the semiconductor film 42. The write voltage has an electric potential (for example, 20 V) for injecting charges (electrons) of the semiconductor film 42 into the charge accumulation film 43*b*. The transfer voltage has an electric potential (for example, 10 V) between the write voltage and the reference voltage. The reference voltage has an electric potential to be a reference (for example, 0 V). With this configuration, charges are accumulated in the charge accumulation film 43*b* of the selected memory cell MT at a position where the conductive layer 6 of the selected word line WL and the semiconductor film 42 intersect each other, and information is written in the selected memory cell MT.

In the process of erasing information from the memory cell MT, a reference voltage is applied to the conductive layer 6 of each word line WL, an erase voltage is applied to the semiconductor film 42, and an intermediate voltage between the two voltages is applied to the select gates SGS and SGD. The erase voltage has an electric potential (for example, 20 V) for injecting opposite charges (holes) of the semiconductor film 42 into the charge accumulation film 43*b*. The reference voltage has an electric potential to be a reference (for example, 0 V). The intermediate voltage has an electric potential (for example, 5 V) between the erase processing and the reference voltage. By such control, electron-hole pairs are generated by Gate Induced Drain Leakage (GIDL) near the drains of the selection transistors SGT and DGT, and opposite charges (holes) are injected from the semiconductor film 42 into the charge accumulation film 43*b*. This operation erases the charge accumulated in the charge accumulation film 43*b* so as to be able to erase the information in the memory cell MT.

Next, the configuration and operation of the controller 302 in the test apparatus 300 will be described.

As illustrated in FIG. 1, the controller 302 includes a processor 302*a*, volatile memory 302*b*, and nonvolatile memory 302*c* as hardware. The nonvolatile memory 302*c* may store a program PG for testing a memory cell.

Figure 8:
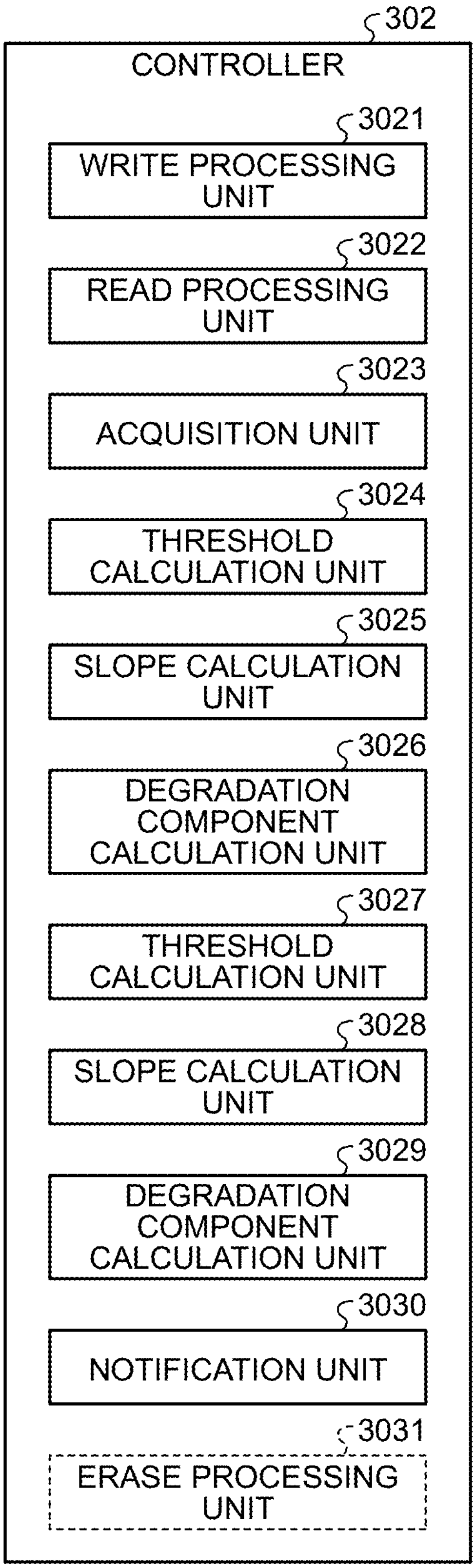
FIG. 8 is a block diagram illustrating a functional configuration of a controller according to the embodiment.

The controller 302 functionally includes a write processing unit 3021, a read processing unit 3022, an acquisition unit 3023, a threshold calculation unit 3024, a slope calculation unit 3025, a degradation component calculation unit 3026, a threshold calculation unit 3027, a slope calculation unit 3028, a degradation component calculation unit 3029, and a notification unit 3030 illustrated in FIG. 8. FIG. 8 is a block diagram illustrating a functional configuration of the controller 302.

In the controller 302, each unit illustrated in FIG. 8 may be implemented in hardware (for example, as a circuit), may be implemented in software, or may be implemented partly in hardware and the rest in software. In a case where each unit illustrated in FIG. 8 is implemented by software, the controller 302 may execute the program PG to functionally construct each unit illustrated in FIG. 8 on the volatile memory 302*b* collectively at the time of compilation or sequentially according to the progress of processing.

The write processing unit 3021 generates a write command in response to an instruction from the user via the input unit 305 or autonomously in accordance with establishment of a predetermined condition, and reads the test data 303*a* from the storage unit 303. The write processing unit 3021 supplies the write command and the test data 303*a* to the interface unit 301. The write command includes an address of a memory cell to be tested. The interface unit 301 supplies the write command and the test data 303*a* to the semiconductor storage device 1 via the communication medium 400.

Figure 9:
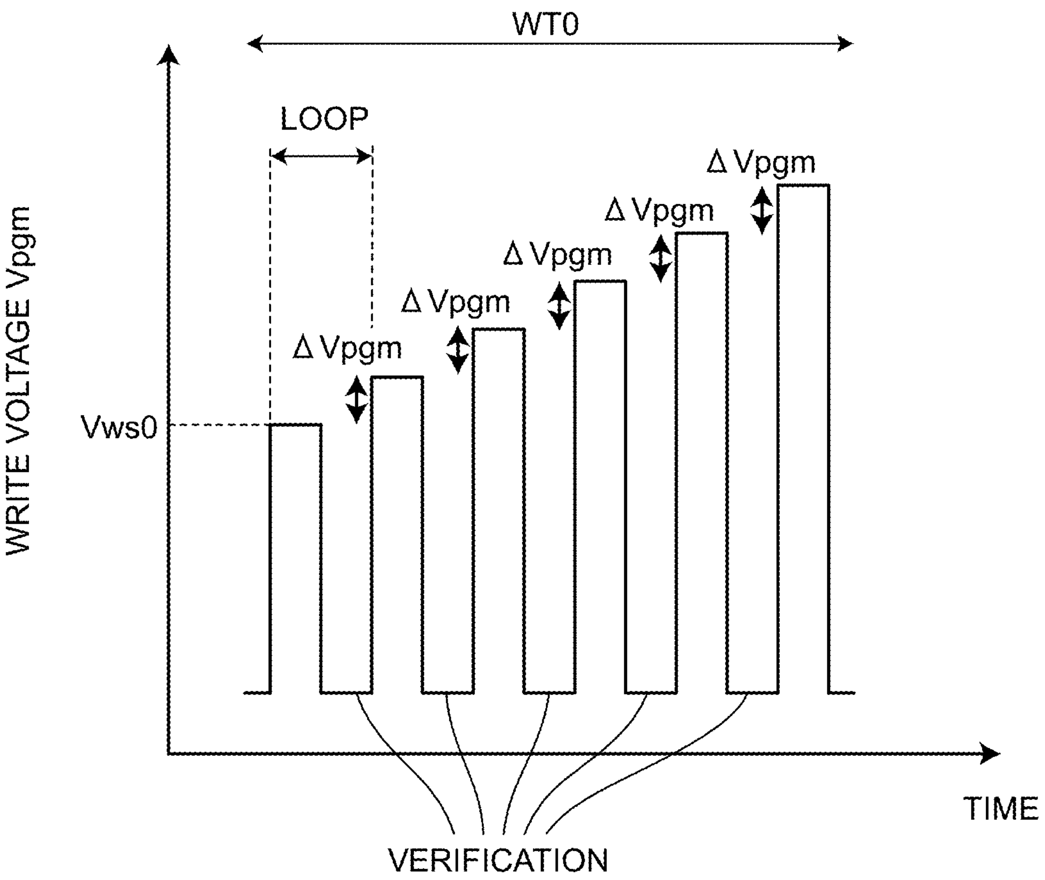
FIG. 9 is a diagram illustrating write processing onto the memory cell in the embodiment.

Having received the write command and the test data, the semiconductor storage device 1 can perform test data write processing onto the memory cell addressed by the write command. In the write processing, as illustrated in FIG. 9, the write operation and the verification operation are repeated with an increasing write voltage. FIG. 9 is a diagram illustrating write processing to the memory cell MT. FIG. 9 illustrates a case where verification is successful in six write operations with the write time of WT0 in the write processing using a write start voltage Vws0 and an increase width ΔVpgm of the write voltage. When the verification operation turns out to be successful to complete the write processing of the test data to the memory cell MT, the semiconductor storage device 1 transmits a write completion notification to the interface unit 301 via the communication medium 400.

Having received the write completion notification, the interface unit 301 supplies the write completion notification to the controller 302.

Thereafter, the read processing unit 3022 illustrated in FIG. 8 generates a read command in response to an instruction from the user via the input unit 305 or autonomously in accordance with establishment of a predetermined condition. The read command includes an address of a memory cell to be tested. The read processing unit 3022 may generate a read command including the address of the memory cell that has undergone write processing. The read processing unit 3022 supplies the read command to the interface unit 301.

Figure 10:
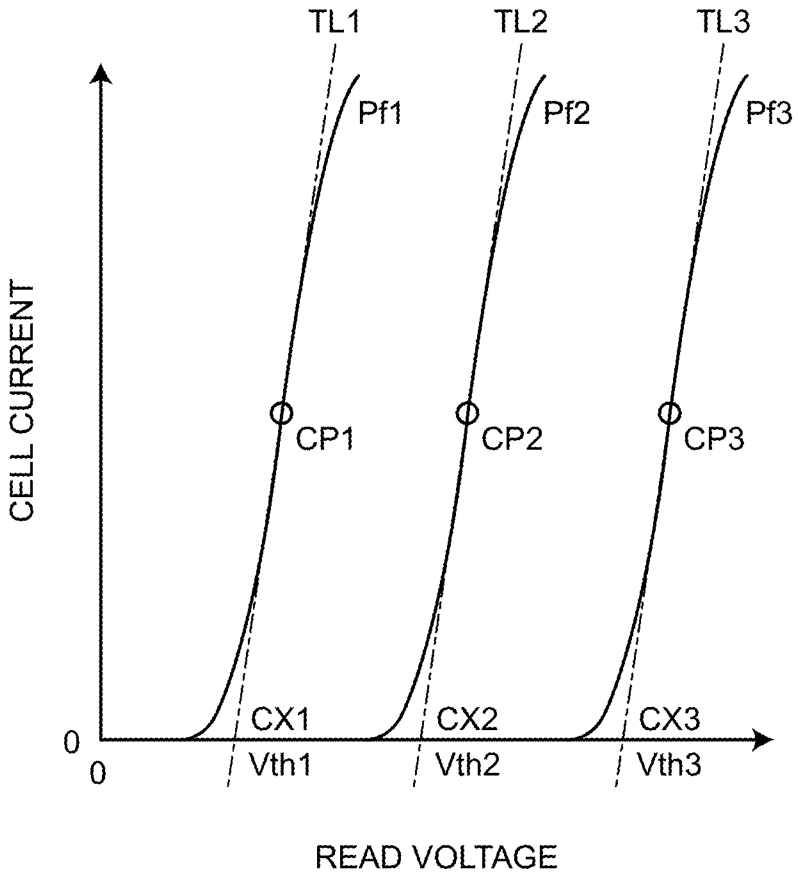
FIG. 10 is a diagram illustrating processing PC1 of obtaining a threshold voltage of a memory cell in the embodiment.
Figure 11:
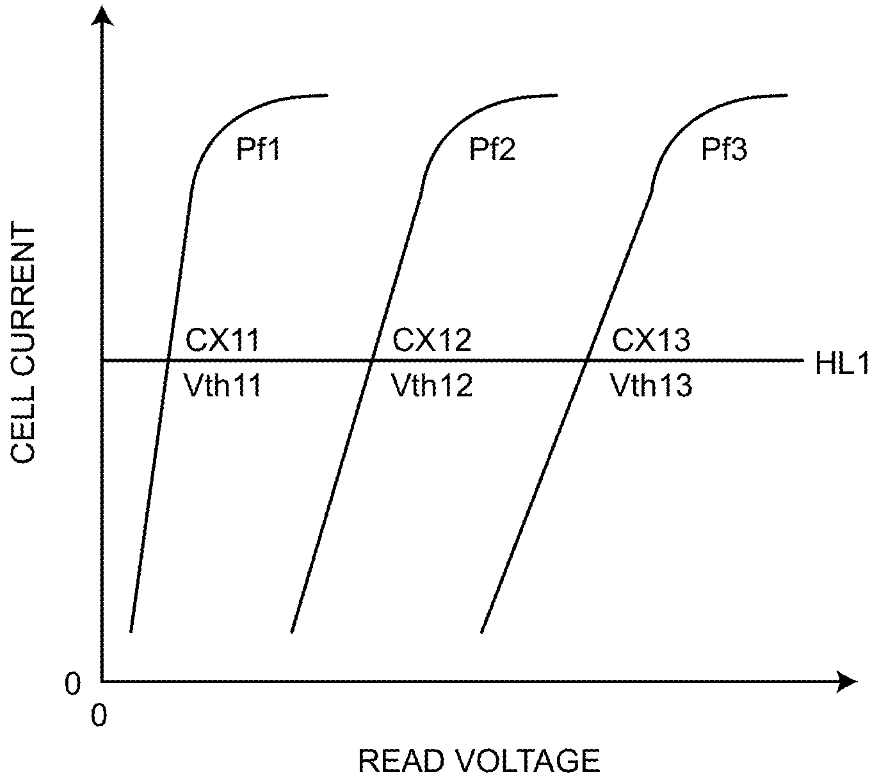
FIG. 11 is a diagram illustrating a processing PC2 of obtaining a threshold voltage of a memory cell in the embodiment.

Having received the read command, the semiconductor storage device 1 can perform the read processing on the memory cell addressed by the read command. The read processing detects the cell current for each memory cell while sweeping the read voltage, as illustrated in FIG. 10 or 11, for example. FIG. 10 is a diagram illustrating processing PC1 of obtaining a threshold voltage of the memory cell MT. FIG. 11 is a diagram illustrating processing PC2 of obtaining a threshold voltage of the memory cell MT.

Having completed the read processing on the memory cell, the semiconductor storage device 1 generates read characteristic information. The read characteristic information indicates a read characteristic. The read characteristic indicates a relationship between the read voltage and the logarithm of the cell current. The semiconductor storage device 1 generates read characteristic information indicating read characteristics Pf1 to Pf3, as illustrated in FIG. 10 or 11, for example. In FIG. 10, the vertical axis indicates the cell current that is not logarithmically-converted (that is plotted on a linear scale), and the horizontal indicates the read voltage. In FIG. 11, the vertical axis indicates the logarithm of the cell current (that is plotted on a logarithmic scale), and the horizontal axis indicates the read voltage. In FIG. 10 or 11, the read voltage is 0 on the vertical axis. In FIG. 10 or 11, read processing is performed on each memory cell MT that undergoes writing in a multi-level cell (MLC) mode, with indications of read characteristics Pf1, Pf2, and Pf3 corresponding to the states ST1, ST2, and ST3, respectively.

Each of the read characteristics Pf1 to Pf3 has a subthreshold region and an overdrive region. The read characteristic Pf is characterized in that, in the subthreshold region, the logarithm of the cell current linearly increases steeply together with an increase in the read voltage. The read characteristic Pf is characterized in that, in the overdrive region, the logarithm of the cell current increases nonlinearly and gradually together with an increase in the read voltage. In each of the read characteristics Pf1 to Pf3, the inclination of the tangent for cell current characteristic that is not logarithmically-converted tends to be maximized near the boundary between the subthreshold region and the overdrive region.

The semiconductor storage device 1 transmits the read characteristic information to the interface unit 301 via the communication medium 400.

The interface unit 301 receives the read characteristic information. Having acquired the read characteristic information 303*b*, the interface unit 301 supplies the read characteristic information 303*b* to the acquisition unit 3023 illustrated in FIG. 8. The acquisition unit 3023 stores the read characteristic information 303*b* in the storage unit 303.

The threshold calculation unit 3024 performs the processing PC1 on the read characteristic indicated by the read characteristic information 303*b* to obtain the threshold voltage of the memory cell. The processing PC1 is processing of obtaining the threshold voltage focusing on an overdrive region in the read characteristic. The processing PC1 includes processing of obtaining a voltage corresponding to a tangent near a boundary between the subthreshold region and the overdrive region in the read characteristic as the threshold voltage. The processing PC1 may include processing using a GM-MAX method.

For example, regarding the graph of the read characteristic Pf1 for cell current that is not logarithmically-converted illustrated in FIG. 10, the threshold calculation unit 3024 calculates the inclination of the tangent for cell current characteristic that is not logarithmically-converted corresponding to the read voltage value while changing the read voltage value, and obtains a coordinate point CP1 including a read voltage value at which the inclination of the tangent is maximized. The threshold calculation unit 3024 obtains an intersection CX1 between a tangent TL1 of the coordinate point CP1 with respect to the graph of the read characteristic Pf1 and the horizontal axis (cell current=0). The threshold calculation unit 3024 sets the read voltage value at the intersection CX1 as a threshold voltage Vth1.

Regarding the graph of the read characteristic Pf2, the threshold calculation unit 3024 calculates the inclination of the tangent for cell current characteristic that is not logarithmically-converted corresponding to the read voltage value while changing the read voltage value, and obtains a coordinate point CP2 including a read voltage value at which the inclination of the tangent is maximized. The threshold calculation unit 3024 obtains an intersection CX2 between a tangent TL2 of the coordinate point CP2 with respect to the graph of the read characteristic Pf2 and the horizontal axis (cell current=0). The threshold calculation unit 3024 sets the read voltage value at the intersection CX2 as a threshold voltage Vth2.

Regarding the graph of the read characteristic Pf3, the threshold calculation unit 3024 calculates the inclination of the tangent for cell current characteristic that is not logarithmically-converted corresponding to the read voltage value while changing the read voltage value, and obtains a coordinate point CP3 including a read voltage value at which the inclination of the tangent is maximized. The threshold calculation unit 3024 obtains an intersection CX3 between a tangent TL3 of the coordinate point CP3 with respect to the graph of the read characteristic Pf3 and the horizontal axis (cell current=0). The threshold calculation unit 3024 sets the read voltage value at the intersection CX3 as a threshold voltage Vth3.

As illustrated in FIG. 10, by using the processing PC1 of obtaining the threshold voltage focusing on the overdrive region, the threshold voltage can be obtained by removing the influence of the fringe effect (influence of the degradation of the inclination in the subthreshold region).

The threshold calculation unit 3024 illustrated in FIG. 8 supplies the threshold voltage obtained in the processing PC1 to the slope calculation unit 3025.

Figure 12:
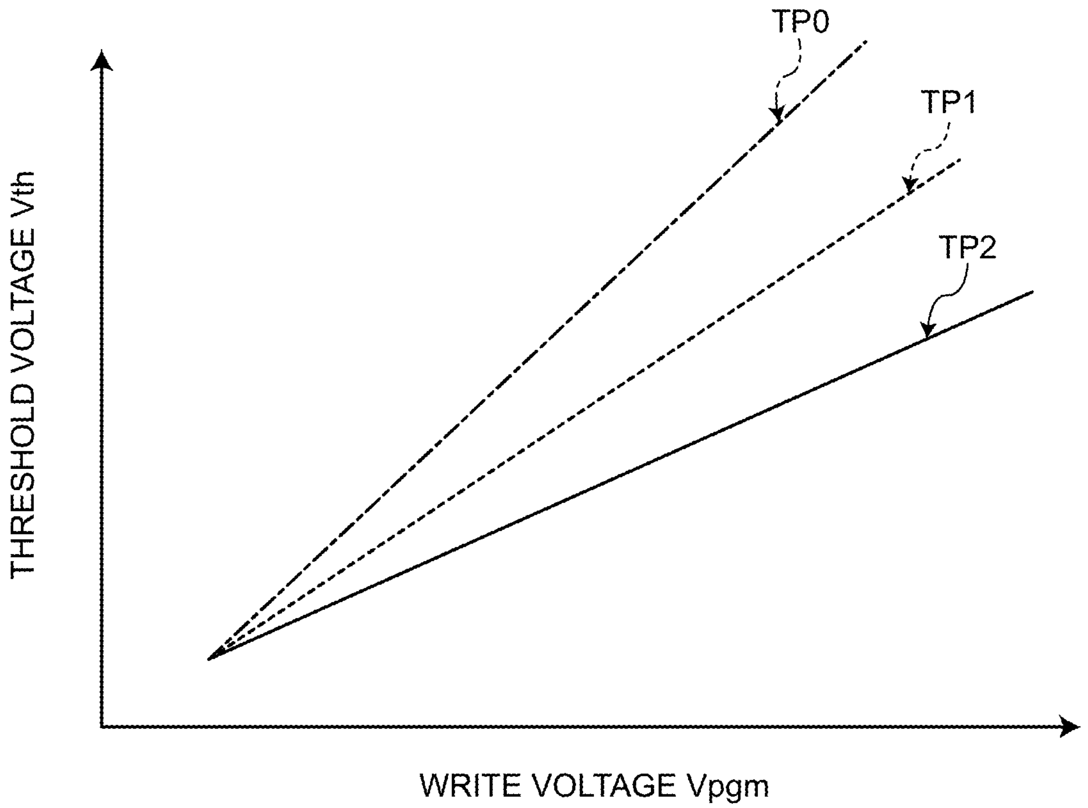
FIG. 12 is a diagram illustrating a relationship between a threshold voltage and a write voltage of a memory cell in the embodiment.

The slope calculation unit 3025 generates the threshold characteristic information 303*c* based on the threshold voltage obtained in the processing PC1. The threshold characteristic information 303*c* indicates a threshold characteristic TP1. The threshold characteristic TP1 indicates a relationship between the write voltage and the threshold voltage in the write processing. As indicated by a dotted line of FIG. 12, the slope calculation unit 3025 may obtain the threshold characteristic TP1 by performing plotting on a plane having the threshold voltage obtained in the processing PC1 and the write voltage during the write processing as coordinate axes so as to generate the threshold characteristic information 303*c*. FIG. 12 is a diagram illustrating a relationship between a threshold voltage Vth of the memory cell MT and a write voltage Vpgm. In FIG. 12, the threshold characteristic TP1 is indicated by a substantially straight line. The threshold characteristic TP1 is characterized in that the threshold voltage Vth tends to linearly increase with the increase in the write voltage Vpgm.

The slope calculation unit 3025 calculates the slope SL1 in the threshold characteristic TP1. The slope SL1 indicates the inclination of the change in the threshold voltage with respect to the write voltage. The slope SL1 corresponds to the inclination of the straight line representing the threshold characteristic TP1 illustrated in FIG. 12. The slope calculation unit 3025 supplies the slope SL1 to the degradation component calculation unit 3026.

The degradation component calculation unit 3026 illustrated in FIG. 8 generates slope degradation component information 303*d* in accordance with the slope SL1. The slope degradation component information 303*d* indicates a slope degradation component ΔDS1. The degradation component calculation unit 3026 may obtain the threshold characteristic TP0 based on ideal conditions. For example, the degradation component calculation unit 3026 may perform simulation under ideal conditions and obtain the threshold characteristic TP0 indicated by a one-dot chain line in FIG. 12 according to the simulation result. In FIG. 12, the threshold characteristic TP0 is indicated by a substantially straight line. The degradation component calculation unit 3026 may calculate the slope SL0 in the threshold characteristic TP0. The slope SL0 corresponds to the inclination of the straight line of the threshold characteristic TP0 illustrated in FIG. 12. The degradation component calculation unit 3026 may subtract the slope SL1 from the slope SL0 to obtain the slope degradation component ΔDS1. The slope degradation component ΔDS1 corresponds to a difference between the inclination of the straight line representing the threshold characteristic TP0 and the inclination of the straight line representing the threshold characteristic TP1 illustrated in FIG. 12. The degradation component calculation unit 3026 stores the slope degradation component information 303*d* in the storage unit 303.

The threshold calculation unit 3027 performs the processing PC2 on the read characteristic indicated by the read characteristic information 303*b* to obtain the threshold voltage of the memory cell. The processing PC2 is processing of obtaining the threshold voltage focusing on the subthreshold region in the read characteristic. The processing PC2 includes processing of obtaining a voltage corresponding to an approximate straight line of the subthreshold region in the read characteristic, as the threshold voltage.

For example, regarding the graph of the read characteristic Pf1 illustrated in FIG. 11, the threshold calculation unit 3027 obtains an intersection CX11 between the subthreshold region of the read characteristic Pf1 and the horizontal line HL1 representing threshold current level (cell current=threshold current level). The threshold calculation unit 3027 sets the read voltage value at the intersection CX11 as a threshold voltage Vth11.

Regarding the graph of the read characteristic Pf2, the threshold calculation unit 3027 obtains an intersection CX12 between the subthreshold region of the read characteristic Pf2 and the horizontal line HL1 representing threshold current level (cell current=threshold current level). The threshold calculation unit 3027 sets the read voltage value at the intersection CX12 as a threshold voltage Vth12.

Regarding the graph of the read characteristic Pf3, the threshold calculation unit 3027 obtains an intersection CX13 between the subthreshold region of the read characteristic Pf3 and the horizontal line HL1 representing threshold current level (cell current=threshold current level). The threshold calculation unit 3027 sets the read voltage value at the intersection CX13 as a threshold voltage Vth13.

As illustrated in FIG. 11, by using the processing PC2 of obtaining the threshold voltage focusing on the subthreshold region, the threshold voltage can be obtained in the mode of including the influence of the fringe effect (influence of the degradation of the inclination in the subthreshold region).

The threshold calculation unit 3027 illustrated in FIG. 8 supplies the threshold voltage obtained in the processing PC2 to the slope calculation unit 3028.

The slope calculation unit 3028 generates threshold characteristic information 303*e* based on the threshold voltage obtained in the processing PC2. The threshold characteristic information 303*e* indicates a threshold characteristic TP2. The threshold characteristic TP2 indicates a relationship between the write voltage and the threshold voltage in the write processing. As indicated by a solid line of FIG. 12, the slope calculation unit 3028 may obtain the threshold characteristic TP2 by performing plotting on a plane having the threshold voltage obtained in the processing PC2 and the write voltage during the write processing as coordinate axes so as to generate the threshold characteristic information 303*e*. In FIG. 12, the threshold characteristic TP2 is indicated by a substantially straight line. The threshold characteristic TP2 is characterized in that the threshold voltage Vth tends to linearly increase with the increase in the write voltage Vpgm.

The slope calculation unit 3028 calculates the slope SL2 in the threshold characteristic TP2. The slope SL2 indicates the inclination of the change in the threshold voltage with respect to the write voltage. The slope SL2 corresponds to the inclination of the straight line of the threshold characteristic TP2 illustrated in FIG. 12. The slope calculation unit 3028 supplies the slope SL2 to the degradation component calculation unit 3029.

The degradation component calculation unit 3029 illustrated in FIG. 8 generates slope degradation component information 303*f* in accordance with the slope SL2. The slope degradation component information 303*f* indicates a slope degradation component ΔDS2. The degradation component calculation unit 3029 may subtract the slope SL2 from the slope SL1 to obtain the slope degradation component ΔDS2. The slope degradation component ΔDS2 corresponds to a difference between the inclination of the straight line representing the threshold characteristic TP1 and the inclination of the straight line representing the threshold characteristic TP2 illustrated in FIG. 12. The degradation component calculation unit 3029 stores the slope degradation component information 303*f* in the storage unit 303.

The notification unit 3030 reads the slope degradation component information 303*d* and the slope degradation component information 303*f* individually from the storage unit 303. The notification unit 3030 may display the slope degradation component ΔDS1 and the slope degradation component ΔDS2 on the display screen 304*a* of the display unit 304. The notification unit 3030 may display the slope degradation component information 303*d* and the slope degradation component information 303*f* on the display screen 304*a* of the display unit 304 in a mode of being able to recognize the magnitude relationship between the slope degradation component ΔDS1 and the slope degradation component ΔDS2. This makes it possible for the test apparatus 300 to notify the user of the slope degradation component ΔDS1 and the slope degradation component ΔDS2. By comparing the slope degradation component ΔDS1 and the slope degradation component ΔDS2 when there is a failure in the memory cell, the cause of the failure can be predicted to some extent.

For example, in a case where the slope degradation component ΔDS1 is larger than the slope degradation component ΔDS2 when there is a failure in the memory cell, a main cause of the failure can be predicted to be a decrease in carrier capture efficiency of the memory cell. This makes it possible to prompt the user to take measures against a decrease in carrier capture efficiency of the memory cell.

In another case where the slope degradation component ΔDS2 is larger than the slope degradation component ΔDS1 when there is a failure in the memory cell, the main cause of the failure can be predicted to be the fringe effect of the memory cell. This makes it possible to prompt the user to take measures against the fringe effect of the memory cell.

Figure 13:
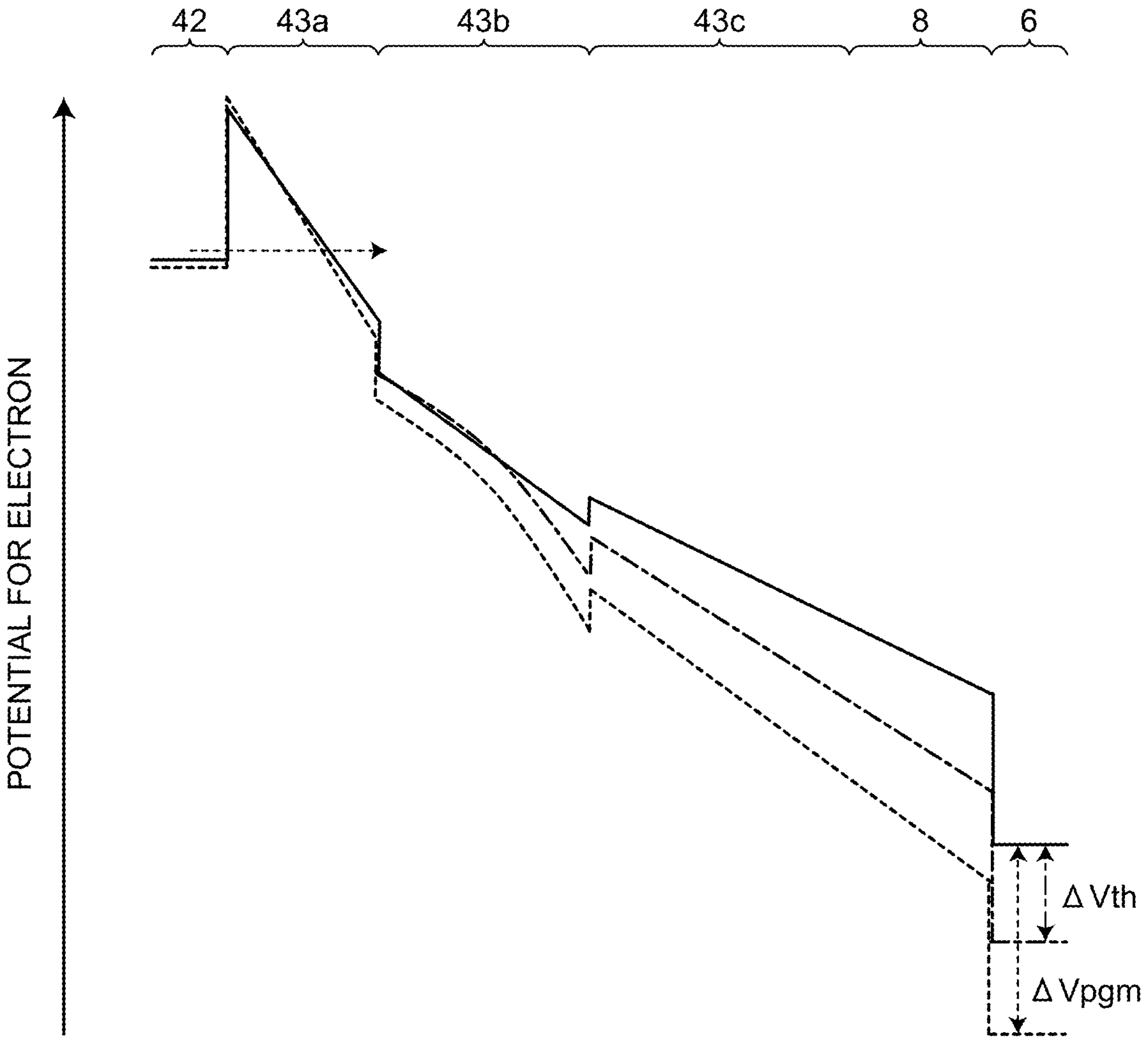
FIG. 13 is a diagram illustrating a change in a band diagram due to slope degradation components in the embodiment.
Figure 14A:
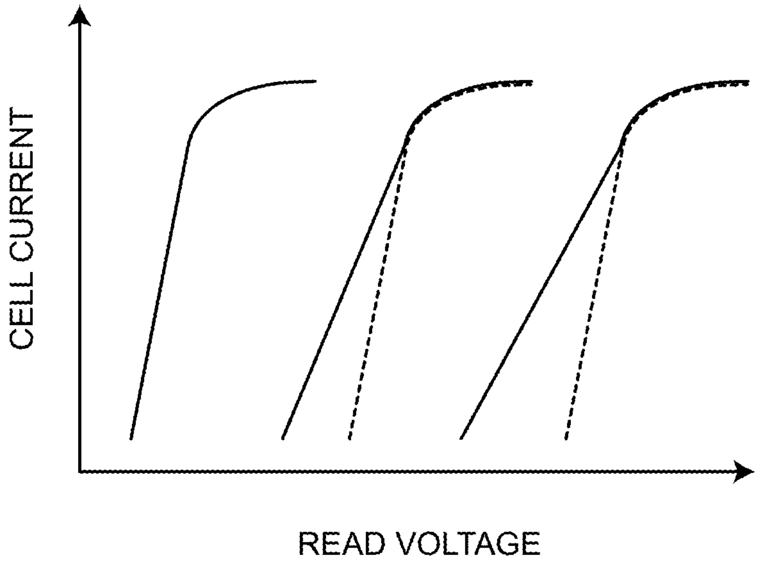
FIGS. 14A and 14B are diagrams illustrating a change in a read characteristic due to a fringe effect and a change in a read characteristic due to a decrease in carrier capture efficiency in the embodiment.
Figure 14B:
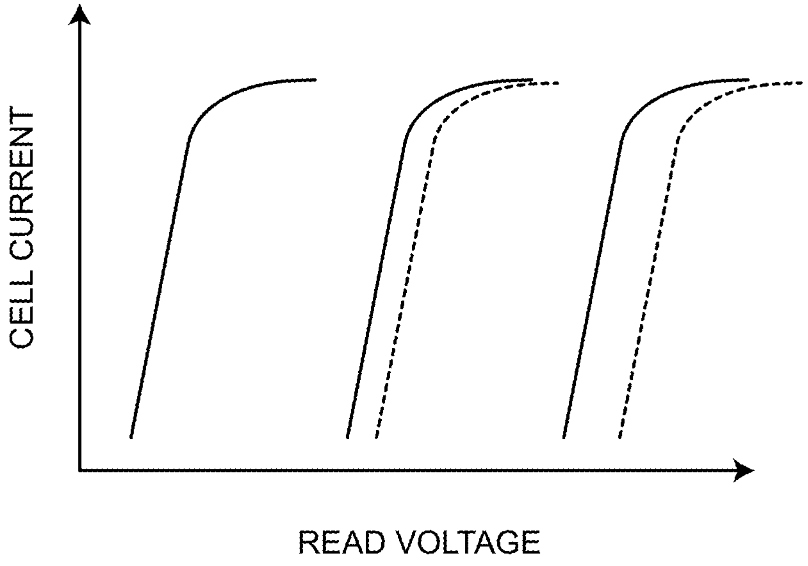

Next, slope degradation components will be described with reference to FIGS. 12 to 14B, etc. Here, FIG. 13 is a diagram illustrating a change in a band diagram due to a slope degradation component. FIGS. 14A and 14B are diagrams illustrating a change in a read characteristic due to a fringe effect and a change in a read characteristic due to a decrease in carrier capture efficiency. FIG. 13 illustrates a band diagram at the time of writing with the structure of "semiconductor film 42/insulating film 43*a*/charge accumulation film 43*b*/insulating film 43*c*/insulating film 8/conductive layer 6" (refer to FIG. 7A). The horizontal direction indicates the XY position in the cross section passing through the central axis CA, and the vertical direction indicates the height of the potential for the electron. The potential for the electrons is opposite in polarity to the electric potential.

FIG. 13 uses a solid line to indicate a potential diagram for electrons immediately before falling of the write voltage Vws0 after the first application of the write voltage Vws0 (refer to FIG. 9) to the conductive layer 6 at writing. Based on this, here is a potential diagram for electrons immediately before falling of voltage in a case where a voltage of Vws0+ΔVpgm increased by ΔVpgm is applied to the conductive layer 6 at second application of the write voltage. As indicated by a dotted arrow, when charges (electrons) injected from the semiconductor film 42 to the insulating film 43*a* (tunnel insulating film) by tunneling injection are captured by the charge accumulation film 43*b*, the potential diagram in solid line for the electrons changes as indicated by a one-dot chain line, for example. Under an ideal condition, the electric field applied to the insulating film 43*a* and the potential for electrons as a result should be the same as at the time of the first writing. Naturally, the charges written in the charge accumulation film through the second write operation should cause the same potential to bend as an upward convex curve to reduce the potential of the conductive layer 6 by ΔVth. At the same time, the potential difference of the conductive layer 6 between the first write operation and the second write operation should be ΔVpgm. That is, in the ideal condition, ΔVpgm=ΔVth is satisfied, and the slope of the ideal threshold characteristic TP0 illustrated in FIG. 12≈(approximately equal to) 1.

However, an occurrence of slope degradation due to a problem at the time of writing would lead to an assumable case where the slope of the threshold characteristic TP1 or TP2 illustrated in FIG. 12 becomes ΔVth/ΔVpgm<1. This case leads to a difference by ΔVpgm>ΔVth, and there is a need to artificially increase the inclination (electric field) of the one-dot chain line in FIG. 13 so as to perform an extra reduction of the potential of the conductive layer 6 by (ΔVpgm−ΔVth). That is, the potential diagram for electrons immediately before the second write voltage falling changes from the one-dot chain line to the dotted line as illustrated in FIG. 13. In addition, the electric field and the potential applied to the insulating film 43*a* (tunnel insulating film) would increase with the number of repetitions of the write operation.

At this time, an increase in the write voltage Vpgm should also increase the electric field of the insulating film 43*a* and the tunnel current a result, but it is experimentally found that the crucial value ΔVth has not increased. This leads to an estimation that the electron capture efficiency has decreased to the extent of canceling the increase in the tunnel current. In other words, the write operation accompanied by slope degradation due to a problem at the time of writing has a tendency of transition in which the tunnel current increases (for example, X times), and the capturing efficiency decreases (for example, 1/X times). In this case, as illustrated in FIG. 14B, the read characteristic can be shifted to the low voltage side. FIG. 14B illustrates an exemplary case where the actually measured subthreshold characteristic indicated by the solid line shifts to the low voltage side with respect to the ideal read characteristic indicated by the dotted line, represented as the change in the read characteristic due to the decrease in carrier capture efficiency.

Meanwhile, slope degradation may occur due to a problem at the time of reading. For example, in a case of reading data of a memory cell having a high threshold voltage Vth, an electric field of the word line WL to which a high read voltage is applied propagates to the semiconductor film 42 between the word lines WL, and an occurrence of a sneak (leakage) electric field to the channel back surface causes degradation of a subthreshold coefficient of the read characteristic as illustrated in FIG. 14A. In this case, the higher the threshold voltage Vth and the read voltage resulting from this, the greater the sneak (leakage) electric field to the channel back surface and the degradation of the subthreshold coefficient as a result.

FIG. 14A illustrates an exemplary case where the actually measured subthreshold coefficient indicated by the solid line is larger than the ideal subthreshold coefficient indicated by the dotted line, represented as a change in the read characteristic due to the fringe effect. Due to such a three-dimensional fringe effect at the time of reading, the higher the level of the state ST (refer to FIGS. 5A to 5E), the higher the significant of the degradation of the subthreshold coefficient and the decrease in the threshold voltage Vth as a result. As a result, as indicated in the threshold characteristic TP1 or TP2 illustrated in FIG. 12, the slope of the threshold characteristic<1. On the other hand, FIG. 14B illustrates slope degradation of the threshold characteristic due to a problem at the time of writing. When being under the influence of the present effect, the slope of the threshold characteristic is less than 1 even if the influence of the degradation of the subthreshold coefficient accompanying the increase in the threshold voltage Vth has been removed. In FIGS. 14A and 14B, the vertical axis indicates the logarithm of the cell current, and the horizontal axis indicates the read voltage.

Figure 15:
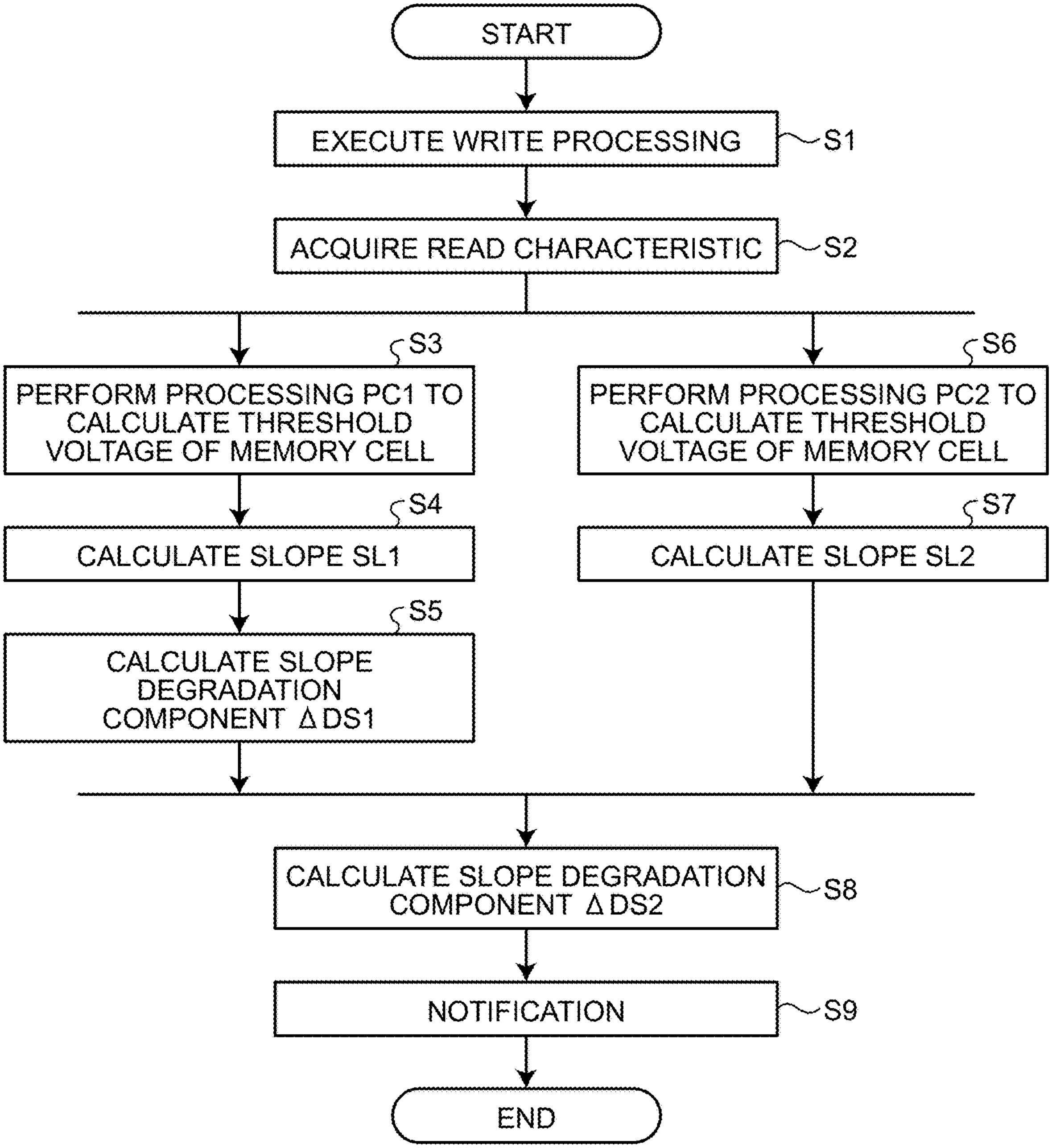
FIG. 15 is a flowchart illustrating operation of the test apparatus according to the embodiment.

Next, operations of the test apparatus 300 will be described with reference to FIG. 15. FIG. 15 is a flowchart illustrating operations of the test apparatus 300.

In the test apparatus 300, the controller 302 controls the semiconductor storage device 1 to execute write processing (S1). The controller 302 generates a test write command and supplies the write command and the test data to the semiconductor storage device 1 via the interface unit 301 and a communication channel 400. With this configuration, write processing is performed in the semiconductor storage device 1. In the write processing, the write operation and the verification operation are repeated with an increasing write voltage. The write processing can be performed by the ISPP method.

The controller 302 controls the semiconductor storage device 1 to execute read processing, and acquires read characteristics from the semiconductor storage device 1 (S2). The controller 302 generates a read command and supplies the generated read command to the semiconductor storage device 1 via the interface unit 301 and the communication channel 400. With this configuration, read processing is performed in the semiconductor storage device 1. The read processing detects the cell current while sweeping the read voltage. As a response to the read command, the controller 302 acquires the read characteristics from the semiconductor storage device 1 via the communication channel 400 and the interface unit 301.

When S2 is completed, the processing of S3 to S5 and the processing of S6 to S7 are performed in parallel.

The controller 302 performs the processing PC1 on the read characteristics to calculate the threshold voltage of the memory cell (S3). The processing PC1 is processing of obtaining the threshold voltage focusing on an overdrive region in the read characteristic. The processing PC1 includes processing of obtaining a voltage corresponding to a tangent near a boundary between the subthreshold region and the overdrive region in the read characteristic as the threshold voltage. The processing PC1 may include processing using a GM-MAX method.

The controller 302 calculates the slope SL1 based on the threshold voltage calculated in S3 (S4). The controller 302 obtains the threshold characteristic TP1 based on the threshold voltage obtained in the processing PC1. The threshold characteristic TP1 indicates a relationship between the write voltage and the threshold voltage in the write processing. The controller 302 may obtain the threshold characteristic TP1 by performing plotting on a plane having the threshold voltage obtained in the processing PC1 and the write voltage during the write processing as coordinate axes. The controller 302 calculates the slope SL1 in the threshold characteristic TP1.

The controller 302 calculates the slope degradation component ΔDS1 based on the slope SL1 calculated in S4 (S5). The controller 302 may obtain a threshold characteristic TP0 based on an ideal condition and may calculate a slope SL0 in a threshold characteristic TP0. The controller 302 may subtract the slope SL1 from the slope SL0 to obtain the slope degradation component ΔDS1.

On the other hand, the controller 302 performs the processing PC2 on the read characteristics to calculate the threshold voltage of the memory cell (S6). The processing PC2 is processing of obtaining the threshold voltage focusing on the subthreshold region in the read characteristic. The processing PC2 includes processing of obtaining a voltage corresponding to an approximate straight line of the subthreshold region in the read characteristic, as the threshold voltage.

The controller 302 calculates the slope SL2 based on the threshold voltage calculated in S6 (S7). The controller 302 obtains the threshold characteristic TP2 based on the threshold voltage obtained by the processing PC2. The threshold characteristic TP2 indicates a relationship between the write voltage and the threshold voltage in the write processing. The controller 302 may obtain the threshold characteristic TP2 by performing plotting on a plane having the threshold voltage obtained in the processing PC2 and the write voltage during the write processing as coordinate axes. The controller 302 calculates a slope SL2 in the threshold characteristic TP2.

When both S5 and S7 are completed, the controller 302 calculates the slope degradation component ΔDS1 based on the slope SL1 calculated in S4 and the slope SL2 calculated in S7 (S8). The controller 302 may subtract the slope SL2 from the slope SL1 to obtain the slope degradation component ΔDS2.

The controller 302 notifies the user of the slope degradation component ΔDS1 and the slope degradation component ΔDS2 (S9). The controller 302 may display the slope degradation component ΔDS1 and the slope degradation component ΔDS2 on the display screen 304*a* of the display unit 304. The controller 302 may display the slope degradation component information 303*d* and the slope degradation component information 303*f* on the display screen 304*a* of the display unit 304 in a mode of being able to recognize the magnitude relationship between the slope degradation component ΔDS1 and the slope degradation component ΔDS2. This makes it possible for the test apparatus 300 to notify the user of the slope degradation component ΔDS1 and the slope degradation component ΔDS2. By comparing the slope degradation component ΔDS1 and the slope degradation component ΔDS2 when there is a failure in the memory cell, the cause of the failure can be predicted to some extent.

For example, in a case where the slope degradation component ΔDS1 is larger than the slope degradation component ΔDS2 when there is a failure in the memory cell, a main cause of the failure can be predicted to be a decrease in carrier capture efficiency of the memory cell. This makes it possible to prompt the user to take measures against a decrease in carrier capture efficiency of the memory cell.

In another case where the slope degradation component ΔDS2 is larger than the slope degradation component ΔDS1 when there is a failure in the memory cell, the main cause of the failure can be predicted to be the fringe effect of the memory cell. This makes it possible to prompt the user to take measures against the fringe effect of the memory cell.

As described above, in the embodiment, in testing the semiconductor storage device 1, the controller 302 of the test apparatus 300 performs the processing PC1 focusing on the overdrive region on the read characteristic of the memory cell that has undergone write processing, and obtains the threshold voltage. With this operation, the threshold voltage can be obtained by removing the influence of the fringe effect (influence of the degradation of the inclination in the subthreshold region). Based on the threshold voltage obtained in the processing PC1, the controller 302 calculates the slope SL1 in the threshold characteristic TP1 indicating the relationship between the write voltage and the threshold voltage, and subtracts the slope SL1 from the slope SL0 in the ideal threshold characteristic TP0 to obtain the slope degradation component ΔDS1. This makes it possible to separate a component indicating degradation due to a decrease in carrier capture efficiency of the memory cell to be obtained as the slope degradation component ΔDS1.

In addition, in the embodiment, in testing the semiconductor storage device 1, the controller 302 of the test apparatus 300 performs the processing PC2 focusing on the subthreshold region on the read characteristic of the memory cell that has undergone write processing, and obtains the threshold voltage. With this operation, the threshold voltage can be obtained in the mode of including the influence of the fringe effect (influence of the degradation of the inclination in the subthreshold region). Based on the threshold voltage obtained in the processing PC2, the controller 302 calculates the slope SL2 in the threshold characteristic TP2 indicating the relationship between the write voltage and the threshold voltage in the write processing, and subtracts the slope SL2 from the slope SL1 to obtain the slope degradation component ΔDS2. This makes it possible to separate a component indicating degradation due to the fringe effect of the memory cell to be obtained as the slope degradation component ΔDS2.

Figure 16:
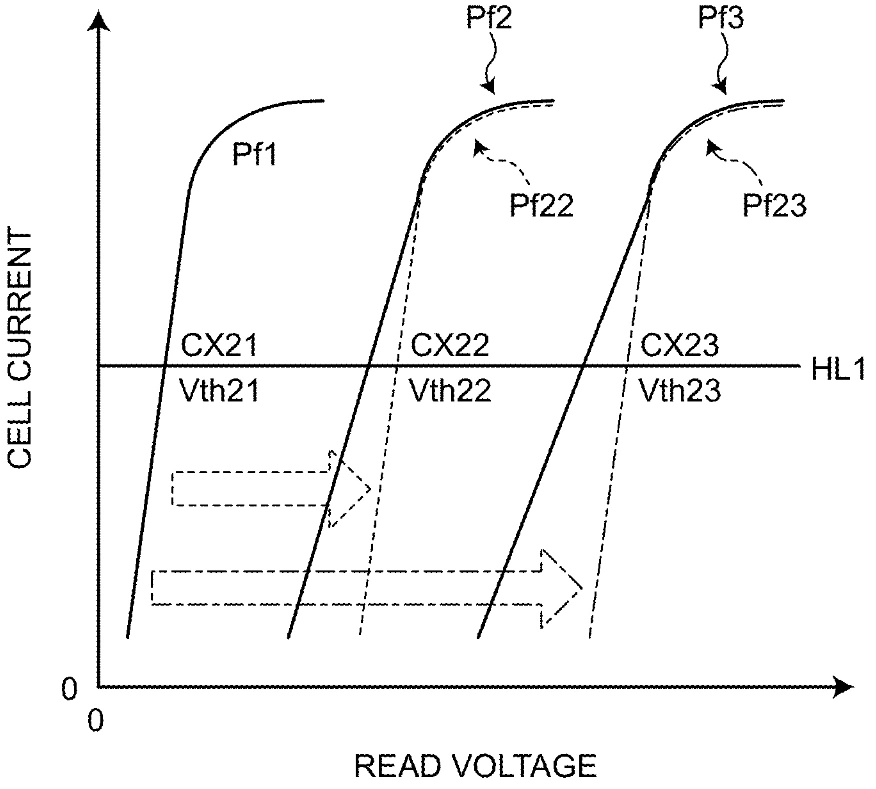
FIG. 16 is a diagram illustrating processing PC11 of obtaining a threshold voltage of a memory cell in a first modification of the embodiment.

As a first modification of the embodiment, the controller 302 of the test apparatus 300 may calculate, in S3 of FIG. 15, the threshold voltage of the memory cell by applying processing PC11 as illustrated in FIG. 16 to the read characteristic instead of the processing PC1 illustrated in FIG. 10. FIG. 16 is a diagram illustrating processing PC11 for obtaining a threshold voltage of a memory cell in the first modification of the embodiment; In FIG. 16, the vertical axis indicates the logarithm of the cell current, and the horizontal axis indicates the read voltage.

The processing PC11 is similar to the processing PC1 in that the threshold voltage is obtained focusing on the overdrive region in the read characteristic, but is different from the processing PC1 in that the threshold voltage is obtained by parallel-translating the duplication of the waveform of the read characteristic on the low level side in the read voltage direction.

For example, regarding the graph of the read characteristic Pf1 on cell current that is logarithmically-converted as illustrated in FIG. 16, the controller 302 obtains an intersection CX21 between the subthreshold region of the read characteristic Pf1 where cell current is logarithmically-converted and the horizontal line HL1 representing threshold current level (cell current=threshold current level). The controller 302 sets the read voltage value at the intersection CX21 as a threshold voltage Vth21.

In obtaining the threshold voltage for the graph of the read characteristic Pf2, the controller 302 non-logarithmically-converts the cell current in each of the read characteristic Pf1 and the read characteristic Pf2, and obtains a read characteristic Pf1' and a read characteristic Pf2'.

The controller 302 parallel-translates the duplication of the waveform of the read characteristic Pf1' in the read voltage direction as indicated by a dotted outlined arrow. The controller 302 fits the duplicated waveform of the read characteristic Pf1' to the waveform of the read characteristic Pf2'. The controller 302 logarithmically-converts the cell current in the fitted read characteristic Pf1' again to obtain a read characteristic Pf22. With this operation, the controller 302 obtains a waveform of the fitted read characteristic Pf22 as indicated by a dotted line. The fitted read characteristic Pf22 has its overdrive region substantially overlapping the overdrive region of the read characteristic Pf2. The controller 302 obtains a threshold voltage corresponding to the read characteristic Pf2 using the waveform of the read characteristic Pf22. That is, the controller 302 obtains an intersection CX22 between the subthreshold region of the read characteristic Pf22 and the horizontal line HL1 representing threshold current level (cell current=threshold current level). The controller 302 sets the read voltage value at the intersection CX22 as a threshold voltage Vth22.

When applying a method of obtaining the read characteristic Pf1 and the read characteristic Pf2 on cell current that is logarithmically-converted based on the read characteristic Pf1' and the read characteristic Pf2' on the cell current that is not logarithmically-converted, the read characteristic Pf1' and the read characteristic Pf2' can be stored in the storage unit 303 in advance, and the stored read characteristic Pf1' and read characteristic Pf2' can be used in the processing PC11 so as to correspond to the read characteristic Pf1 and the read characteristic Pf2, respectively.

In obtaining the threshold voltage for the graph of the read characteristic Pf3, the controller 302 non-logarithmically-converts the cell current in each of the read characteristic Pf1 and the read characteristic Pf3, and obtains the read characteristic Pf1' and a read characteristic Pf3'.

The controller 302 parallel-translates the duplication of the waveform of the read characteristic Pf1' in the read voltage direction as indicated by a one-dot chain line outlined arrow. The controller 302 fits the duplicated waveform of the read characteristic Pf1' to the waveform of the read characteristic Pf3'. The controller 302 logarithmically-converts the cell current in the fitted read characteristic Pf1' again to obtain a read characteristic Pf23. With this operation, the controller 302 obtains a waveform of the fitted read characteristic Pf23 as indicated by a one-dot chain line. The fitted read characteristic Pf23 has its overdrive region substantially overlapping the overdrive region of the read characteristic Pf3. The controller 302 obtains a threshold voltage corresponding to the read characteristic Pf3 using the waveform of the read characteristic Pf23. That is, the controller 302 obtains an intersection CX23 between the subthreshold region of the read characteristic Pf23 and the horizontal line HL1 representing threshold current level (cell current=threshold current level). The controller 302 sets the read voltage value at the intersection CX23 as a threshold voltage Vth23.

When applying a method of obtaining the read characteristic Pf1 and the read characteristic Pf3 on cell current that is logarithmically-converted based on the read characteristic Pf1' and the read characteristic Pf3' on cell current that is not logarithmically-converted, the read characteristic Pf1' and the read characteristic Pf3' can be stored in the storage unit 303 in advance, and the stored read characteristic Pf1' and read characteristic Pf3' can be used in the processing PC11 so as to correspond to the read characteristic Pf1 and the read characteristic Pf3, respectively.

As illustrated in FIG. 16, also by using the processing PC11 of obtaining the threshold voltage focusing on the overdrive region, the threshold voltage can be obtained by removing the influence of the fringe effect (influence of the degradation of the inclination in the subthreshold region).

In addition, the concept of the embodiment can be applied to a test of a memory cell subjected to the erase processing in addition to a test of a memory cell subjected to the write processing.

As a second modification of the embodiment, the controller 302 may functionally further include an erase processing unit 3031 illustrated in FIG. 8. The erase processing unit 3031 autonomously generates an erase command in response to an instruction from the user via the input unit 305 or in accordance with establishment of a predetermined condition. The erase processing unit 3031 supplies the erase command to the interface unit 301. The erase command includes an address of a memory cell to be tested. The interface unit 301 supplies the erase command to the semiconductor storage device 1 via the communication medium 400.

Figure 17:
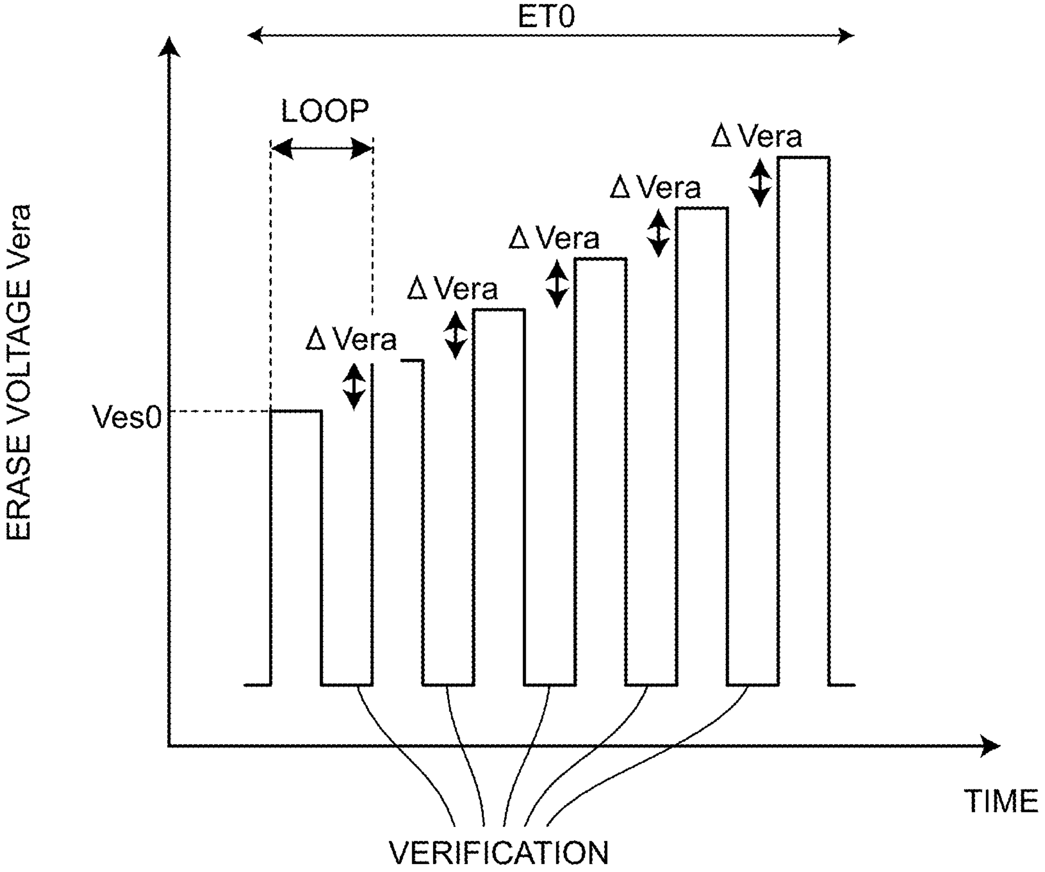
FIG. 17 is a diagram illustrating erase processing for a memory cell in a second modification of the embodiment.

Having received the erase command, the semiconductor storage device 1 can perform the erase processing on the memory cell addressed by the erase command. The erase processing may be performed by an Incremental Step Pulse Erasing (ISPE) method. In the erase processing, as illustrated in FIG. 17, the erase operation and the verification operation are repeated while increasing the erase voltage. FIG. 17 is a diagram illustrating erase processing for the memory cell MT. FIG. 17 illustrates a case where the verification is successful in six erase operations and the erase time is ET0 in the erase processing using the erasing start voltage Ves0 and an increase width ΔVera of the erase voltage. When the verification operation turns out to be successful to complete the erase processing of the test data to the memory cell MT, the semiconductor storage device 1 transmits an erase completion notification to the interface unit 301 via the communication medium 400.

Having received the erase completion notification, the interface unit 301 supplies the erase completion notification to the controller 302.

Thereafter, the read processing unit 3022 illustrated in FIG. 8 generates a read command in response to an instruction from the user via the input unit 305 or autonomously in accordance with establishment of a predetermined condition. The read command includes an address of a memory cell to be tested. The read processing unit 3022 may generate a read command including the address of the memory cell that has undergone the erase processing. The read processing unit 3022 supplies the read command to the interface unit 301.

Figure 18:
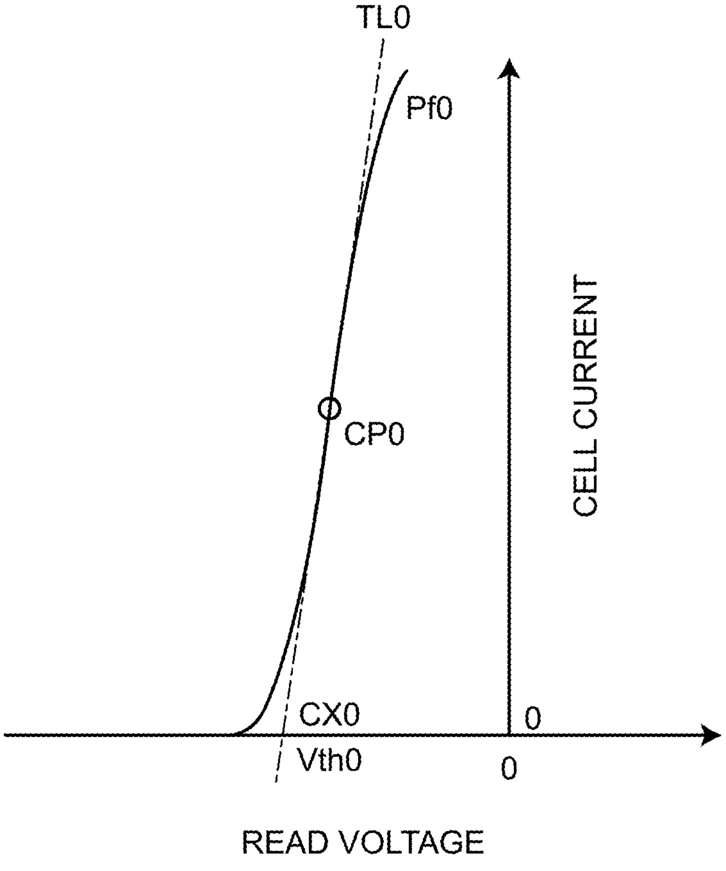
FIG. 18 is a diagram illustrating processing PC1 of obtaining a threshold voltage of a memory cell in the second modification of the embodiment.
Figure 19:
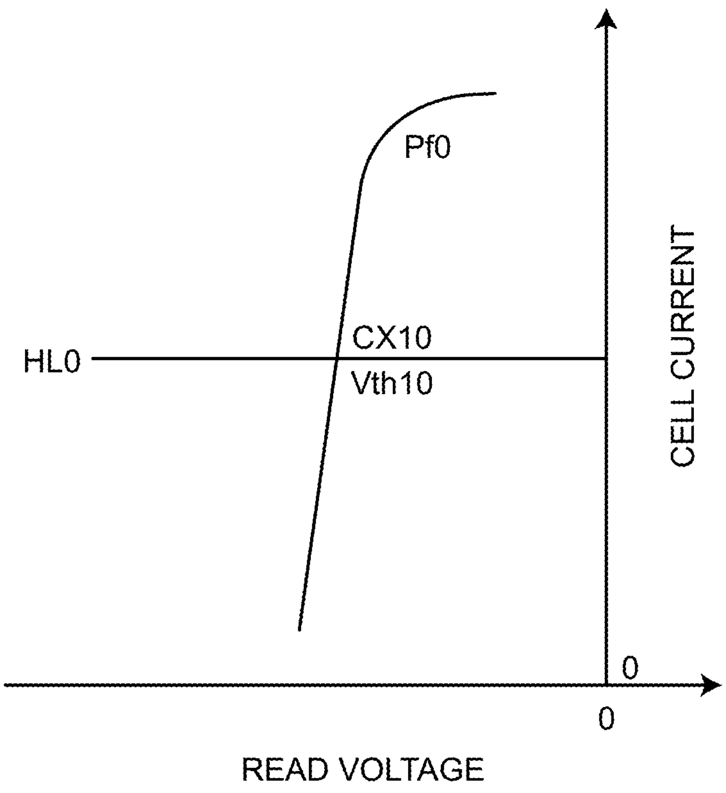
FIG. 19 is a diagram illustrating processing PC2 of obtaining a threshold voltage of the memory cell in the second modification of the embodiment.

Having received the read command, the semiconductor storage device 1 can perform the read processing on the memory cell addressed by the read command. The read processing detects the cell current for each memory cell while sweeping the read voltage, as illustrated in FIG. 18 or 19, for example. FIG. 18 is a diagram illustrating processing PC1 of obtaining a threshold voltage of the memory cell MT. FIG. 19 is a diagram illustrating processing PC2 of obtaining a threshold voltage of the memory cell MT.

Having completed the read processing on the memory cell, the semiconductor storage device 1 generates read characteristic information. The read characteristic information indicates a read characteristic. The read characteristic indicates a relationship between the read voltage and the logarithm of the cell current. The semiconductor storage device 1 generates read characteristic information indicating the read characteristic Pf0, as illustrated in FIG. 18 or 19, for example. In FIG. 18, the vertical axis indicates the cell current that is not logarithmically-converted, and the horizontal axis indicates the read voltage. In FIG. 19, the vertical axis indicates the logarithm of the cell current, and the horizontal axis indicates the read voltage. In FIG. 18 or 19, the read voltage is 0 on the vertical axis. In FIG. 18 or 19, read processing is performed on each memory cell MT written in a multi-level cell (MLC) mode, and the read characteristic Pf0 corresponding to the state ST0 is illustrated.

The read characteristic Pf0 has a subthreshold region and an overdrive region. In the subthreshold region, the read characteristic Pf0 is characterized in that the logarithm of the cell current linearly increases steeply together with an increase in the read voltage. In the overdrive region, the read characteristic Pf0 is characterized in that the logarithm of the cell current increases nonlinearly and gradually together with an increase in the read voltage. In the read characteristic Pf0, the inclination of the tangent for cell current characteristic that is not logarithmically-converted tends to be maximized near the boundary between the subthreshold region and the overdrive region.

The semiconductor storage device 1 transmits the read characteristic information to the interface unit 301 via the communication medium 400.

The interface unit 301 receives the read characteristic information. Having acquired the read characteristic information 303*b*, the interface unit 301 supplies the read characteristic information 303*b* to the acquisition unit 3023 illustrated in FIG. 8. The acquisition unit 3023 stores the read characteristic information 303*b* in the storage unit 303.

The threshold calculation unit 3024 performs the processing PC1 on the read characteristic indicated by the read characteristic information 303*b* to obtain the threshold voltage of the memory cell. The processing PC1 is processing of obtaining the threshold voltage focusing on an overdrive region in the read characteristic. The processing PC1 includes processing of obtaining a voltage corresponding to a tangent near a boundary between the subthreshold region and the overdrive region in the read characteristic as the threshold voltage. The processing PC1 may include processing using a GM-MAX method.

For example, regarding the graph of the read characteristic Pf0 on cell current that is not logarithmically-converted illustrated in FIG. 18, the threshold calculation unit 3024 calculates the inclination of the tangent for cell current characteristic (that is not logarithmically-converted) corresponding to the read voltage value while changing the read voltage value, and obtains a coordinate point CP0 including a read voltage value at which the inclination of the tangent is maximized. The threshold calculation unit 3024 obtains an intersection CX0 between a tangent TL0 of the coordinate point CP0 with respect to the graph of the read characteristic Pf0 and the horizontal axis (cell current=0). The threshold calculation unit 3024 sets the read voltage value at the intersection CX0 as a threshold voltage Vth0.

As illustrated in FIG. 18, in the processing PC1 of obtaining the threshold voltage focusing on the overdrive region, the threshold voltage can be obtained by removing the influence of the fringe effect (the influence of the degradation of the inclination in the subthreshold region).

The threshold calculation unit 3024 illustrated in FIG. 8 supplies the threshold voltage obtained in the processing PC1 to the slope calculation unit 3025.

Figure 20:
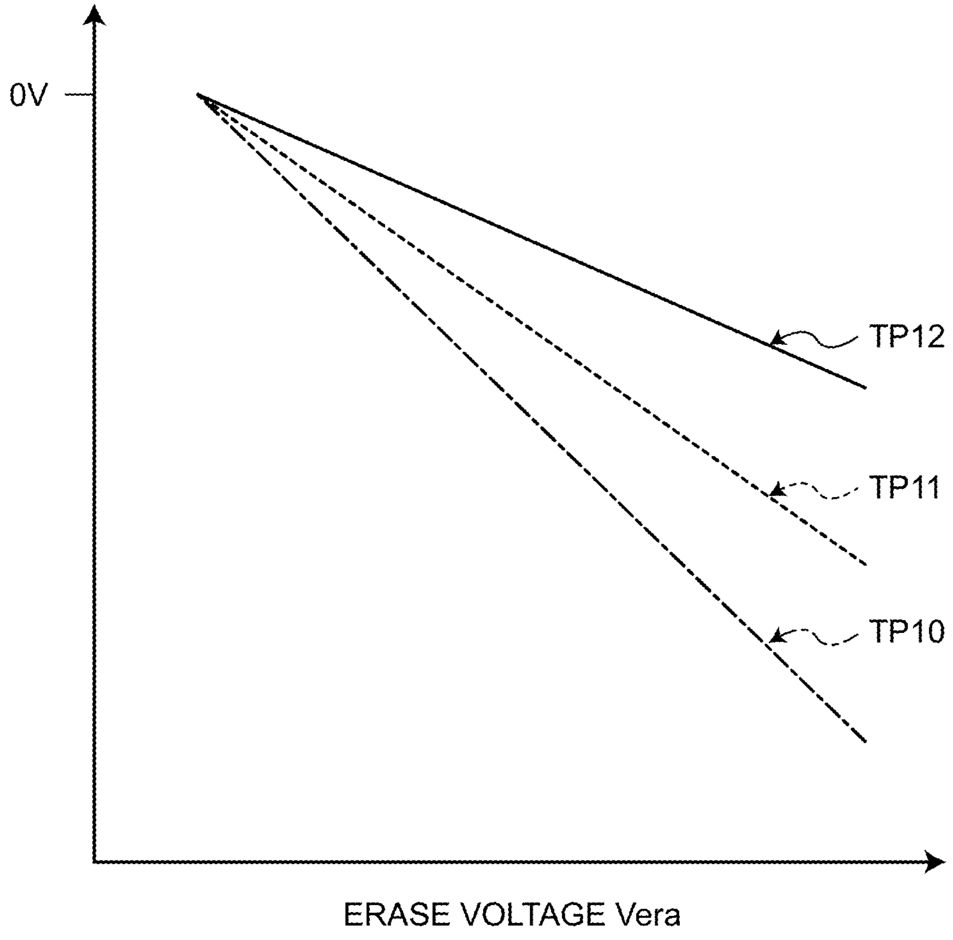
FIG. 20 is a diagram illustrating a relationship between a threshold voltage and an erase voltage of a memory cell in the second modification of the embodiment.

The slope calculation unit 3025 generates the threshold characteristic information 303*c* based on the threshold voltage obtained in the processing PC1. The threshold characteristic information 303*c* indicates a threshold characteristic TP11. The threshold characteristic TP11 indicates a relationship between the erase voltage and the threshold voltage in the erase processing. As indicated by a dotted line of FIG. 20, the slope calculation unit 3025 may obtain the threshold characteristic TP11 by performing plotting on a plane having the threshold voltage obtained in the processing PC1 and the erase voltage during the erase processing as coordinate axes so as to generate the threshold characteristic information 303*c*. FIG. 20 is a diagram illustrating a relationship between the threshold voltage Vth of the memory cell MT and the erase voltage Vera. In FIG. 20, the threshold characteristic TP11 is indicated by a substantially straight line. In the threshold characteristic TP11, the threshold voltage Vth tends to linearly decrease with the increase in the erase voltage Vera.

The slope calculation unit 3025 calculates the slope SL11 in the threshold characteristic TP11. The slope SL11 indicates an inclination of change of the threshold voltage with respect to the erase voltage. The slope SL11 corresponds to the inclination of the straight line of the threshold characteristic TP11 illustrated in FIG. 20. The slope calculation unit 3025 supplies the slope SL11 to the degradation component calculation unit 3026.

The degradation component calculation unit 3026 illustrated in FIG. 8 generates slope degradation component information 303*d* in accordance with the slope SL11. The slope degradation component information 303*d* indicates a slope degradation component ΔDS11. The degradation component calculation unit 3026 may obtain a threshold characteristic TP10 based on ideal conditions. For example, the degradation component calculation unit 3026 may perform simulation under ideal conditions and obtain the threshold characteristic TP10 indicated by a one-dot chain line in FIG. 20 according to the simulation result. In FIG. 20, the threshold characteristic TP10 is indicated by a substantially straight line. The degradation component calculation unit 3026 may calculate a slope SL10 in the threshold characteristic TP10. The slope SL10 corresponds to the inclination of the straight line of the threshold characteristic TP10 illustrated in FIG. 20. The degradation component calculation unit 3026 may subtract the slope SL11 from the slope SL10 to obtain the slope degradation component ΔDS11. The slope degradation component ΔDS11 corresponds to a difference between the inclination of the straight line representing the threshold characteristic TP10 and the inclination of the straight line representing the threshold characteristic TP11 illustrated in FIG. 20. The degradation component calculation unit 3026 stores the slope degradation component information 303*d* in the storage unit 303.

The threshold calculation unit 3027 performs the processing PC2 on the read characteristic indicated by the read characteristic information 303*b* to obtain the threshold voltage of the memory cell. The processing PC2 is processing of obtaining the threshold voltage focusing on the subthreshold region in the read characteristic. The processing PC2 includes processing of obtaining a voltage corresponding to an approximate straight line of the subthreshold region in the read characteristic, as the threshold voltage.

For example, regarding the graph of the read characteristic Pf0 on cell current that is logarithmically-converted illustrated in FIG. 19, the threshold calculation unit 3027 obtains an intersection CX10 between the subthreshold region of the read characteristic Pf0 where cell current is logarithmically-converted and the horizontal line HL0 representing threshold current level of erase state (cell current=threshold current level of erase state). The threshold calculation unit 3027 sets the read voltage value at the intersection CX10 as a threshold voltage Vth10.

As illustrated in FIG. 19, by using the processing PC2 of obtaining the threshold voltage focusing on the subthreshold region, the threshold voltage can be obtained in the mode of including the influence of the fringe effect (influence of the degradation of the inclination in the subthreshold region).

The threshold calculation unit 3027 illustrated in FIG. 8 supplies the threshold voltage obtained in the processing PC2 to the slope calculation unit 3028.

The slope calculation unit 3028 generates threshold characteristic information 303*e* based on the threshold voltage obtained in the processing PC12. The threshold characteristic information 303*e* indicates a threshold characteristic TP12. The threshold characteristic TP12 indicates a relationship between the erase voltage and the threshold voltage in the erase processing. As indicated by a solid line of FIG. 20, the slope calculation unit 3028 may obtain a threshold characteristic TP12 by performing plotting on a plane having the threshold voltage obtained in the processing PC12 and the erase voltage during the erase processing as coordinate axes so as to generate the threshold characteristic information 303*e*. In FIG. 20, the threshold characteristic TP12 is indicated by a substantially straight line. In the threshold characteristic TP12, the threshold voltage Vth tends to linearly decrease with the increase in the erase voltage Vera.

The slope calculation unit 3028 calculates the slope SL12 in the threshold characteristic TP12. The slope SL12 indicates an inclination of change of the threshold voltage with respect to the erase voltage. The slope SL12 corresponds to the inclination of the straight line of the threshold characteristic TP12 illustrated in FIG. 20. The slope calculation unit 3028 supplies the slope SL12 to the degradation component calculation unit 3029.

The degradation component calculation unit 3029 illustrated in FIG. 8 generates slope degradation component information 303*f* in accordance with the slope SL12. The slope degradation component information 303*f* indicates a slope degradation component ΔDS12. The degradation component calculation unit 3029 may subtract the slope SL12 from the slope SL11 to obtain the slope degradation component ΔDS12. The slope degradation component ΔDS12 corresponds to a difference between the inclination of the straight line representing the threshold characteristic TP11 and the inclination of the straight line representing the threshold characteristic TP12 illustrated in FIG. 20. The degradation component calculation unit 3029 stores the slope degradation component information 303*f* in the storage unit 303.

The notification unit 3030 reads the slope degradation component information 303*d* and the slope degradation component information 303*f* individually from the storage unit 303. The notification unit 3030 may display the slope degradation component ΔDS11 and the slope degradation component ΔDS12 on the display screen 304*a* of the display unit 304. The notification unit 3030 may display the slope degradation component information 303*d* and the slope degradation component information 303*f* on the display screen 304*a* of the display unit 304 in a mode of being able to recognize the magnitude relationship between the slope degradation component ΔDS11 and the slope degradation component ΔDS12. This makes it possible for the test apparatus 300 to notify the user of the slope degradation component ΔDS11 and the slope degradation component ΔDS12. By comparing the slope degradation component ΔDS11 and the slope degradation component ΔDS12 when there is a failure in the memory cell, the cause of the failure can be predicted to some extent.

For example, in a case where the slope degradation component ΔDS11 is larger than the slope degradation component ΔDS12 when there is a failure in the memory cell, a main cause of the failure can be predicted to be a decrease in carrier capture efficiency of the memory cell. This makes it possible to prompt the user to take measures against a decrease in carrier capture efficiency of the memory cell.

In another case where the slope degradation component ΔDS12 is larger than the slope degradation component ΔDS11 when there is a failure in the memory cell, the main cause of the failure can be predicted to be the fringe effect of the memory cell. This makes it possible to prompt the user to take measures against the fringe effect of the memory cell.

In this manner, in testing the semiconductor storage device 1, the controller 302 of the test apparatus 300 performs the processing PC1 focusing on the overdrive region on the read characteristic of the memory cell that has undergone erase processing, and obtains the threshold voltage. With this operation, the threshold voltage can be obtained by removing the influence of the fringe effect (influence of the degradation of the inclination in the subthreshold region). Based on the threshold voltage obtained in the processing PC1, the controller 302 calculates the slope SL11 in the threshold characteristic TP11 indicating the relationship between the erase voltage and the threshold voltage, and subtracts the slope SL11 from the slope SL10 in a predetermined threshold characteristic TP10 to obtain the slope degradation component ΔDS11. This makes it possible to separate a component indicating degradation due to a decrease in carrier capture efficiency of the memory cell to be obtained as the slope degradation component ΔDS11.

In addition, in testing the semiconductor storage device 1, the controller 302 of the test apparatus 300 performs the processing PC2 focusing on the subthreshold region on the read characteristic of the memory cell that has undergone erase processing, and obtains the threshold voltage. With this operation, the threshold voltage can be obtained in the mode of including the influence of the fringe effect (influence of the degradation of the inclination in the subthreshold region). Based on the threshold voltage obtained in the processing PC2, the controller 302 calculates the slope SL12 in the threshold characteristic TP12 indicating the relationship between the erase voltage and the threshold voltage in the erase processing, and subtracts the slope SL12 from the slope SL11 to obtain the slope degradation component ΔDS12. This makes it possible to separate a component indicating degradation due to the fringe effect of the memory cell to be obtained as the slope degradation component ΔDS12.

Moreover, in testing the memory cell that has undergone erase processing, the controller 302 of the test apparatus 300 may calculate the threshold voltage of the memory cell by applying processing PC11 as illustrated in FIG. 16 to the read characteristic instead of the processing PC1. Details of the processing PC11 are similar to those of the first modification of the embodiment. Accordingly, also by using the processing PC11 of obtaining the threshold voltage focusing on the overdrive region, the threshold voltage can be obtained by removing the influence of the fringe effect (influence of the degradation of the inclination in the subthreshold region).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A test apparatus comprising:

an interface unit that acquires a read characteristic indicating a relationship between a read voltage of a memory cell and a logarithm of a cell current, the memory cell being subject to write processing in which a write operation and a verification operation are repeated with increasing write voltage; and a controller that obtains a threshold voltage of the memory cell by performing first processing on the read characteristic, the first processing being processing of, when a subthreshold region in the read characteristic is defined as a first region, focusing on a second region being a region of a read voltage larger than a maximum read voltage of the first region, calculates a first slope in a first threshold characteristic indicating a relationship between a write voltage and the threshold voltage in the write processing, based on the threshold voltage obtained in the first processing, and subtracts the first slope from a slope in a predetermined threshold characteristic to obtain a first slope degradation component, the predetermined threshold characteristic being a threshold characteristic obtained based on an ideal condition.

2. The test apparatus according to claim 1, wherein the controller obtains the threshold voltage of the memory cell by performing second processing on the read characteristic, the second processing being processing of focusing on the first region in the read characteristic, calculates a second slope in a second threshold characteristic indicating a relationship between a write voltage and a threshold voltage in the write processing, based on the threshold voltage obtained in the second processing, and subtracts the second slope from the first slope to obtain a second slope degradation component.

3. The test apparatus according to claim 2, wherein the first slope degradation component indicates degradation related to carrier capture efficiency of the memory cell, and the second slope degradation component indicates degradation related to a fringe effect of the memory cell.

4. The test apparatus according to claim 1, wherein the controller, as the first processing, obtains a threshold voltage corresponding to a tangent that maximizes an inclination of a waveform of the read characteristic.

5. The test apparatus according to claim 4, wherein the first slope degradation component indicates degradation related to carrier capture efficiency of the memory cell.

6. The test apparatus according to claim 1, wherein the interface unit acquires a first read characteristic and a second read characteristic of a memory cell, and the controller, as the first processing, uses a third read characteristic and a fourth read characteristic obtained by non-logarithmically-converting the cell current in each of the first read characteristic and the second read characteristic to parallel-translate a duplication of a waveform of the third read characteristic in a read voltage direction so as to fit the duplication of the waveform of the third read characteristic to a waveform of the fourth read characteristic, logarithmically-converts the cell current in the fitted third read characteristic to obtain a waveform of a fifth read characteristic, and uses the waveform of the fifth read characteristic to obtain a threshold voltage corresponding to the second read characteristic.

7. The test apparatus according to claim 6, wherein the first slope degradation component indicates degradation related to carrier capture efficiency of the memory cell.

8. The test apparatus according to claim 1, wherein the first slope degradation component indicates degradation related to carrier capture efficiency of the memory cell.

9. The test apparatus according to claim 1, wherein the interface unit acquires a read characteristic indicating a relationship between a read voltage of the memory cell and a logarithm of a cell current, the memory cell being subject to erase processing in which an erase operation and a verification operation are repeated with increasing erase voltage, and the controller performs the first processing on the read characteristic to obtain a threshold voltage of the memory cell, calculates a third slope in a third threshold characteristic indicating a relationship between an erase voltage and a threshold voltage in the erase processing, based on the threshold voltage obtained in the first processing, and subtracts the third slope from the slope in the predetermined threshold characteristic to obtain a third slope degradation component.

10. The test apparatus according to claim 9, wherein the controller obtains the threshold voltage of the memory cell by performing second processing on the read characteristic, the second processing being processing of focusing on the first region in the read characteristic, calculates a fourth slope in a fourth threshold characteristic indicating a relationship between the erase voltage and the threshold voltage in the erase processing, based on the threshold voltage obtained in the second processing, and subtracts the fourth slope from the third slope to obtain a fourth slope degradation component.

11. The test apparatus according to claim 10, wherein the predetermined threshold characteristic is a threshold characteristic obtained based on an ideal condition.

12. A test method comprising:

acquiring a read characteristic indicating a relationship between a read voltage of a memory cell and a logarithm of a cell current, the memory cell being subject to write processing in which a write operation and a verification operation are repeated with increasing write voltage;

obtaining a threshold voltage of the memory cell by performing first processing on the read characteristic, the first processing being processing of, when a subthreshold region in the read characteristic is defined as a first region, focusing on a second region being a region of a read voltage larger than a maximum read voltage of the first region;

calculating a first slope in a threshold characteristic indicating a relationship between a write voltage and the threshold voltage in the write processing, based on the threshold voltage obtained in the first processing; and subtracting the calculated first slope from a slope in a predetermined threshold characteristic to obtain a first slope degradation component.

13. The test method according to claim 12, further comprising:

obtaining the threshold voltage of the memory cell by performing second processing on the read characteristic, the second processing being processing of focusing on the first region in the read characteristic;

calculating a second slope in a threshold characteristic indicating a relationship between a write voltage and a threshold voltage in the write processing, based on the threshold voltage obtained in the second processing; and subtracting the second slope from the first slope to obtain a second slope degradation component.

14. The test method according to claim 13, wherein the first slope degradation component indicates degradation related to carrier capture efficiency of the memory cell, and the second slope degradation component indicates degradation related to a fringe effect of the memory cell.

15. The test method according to claim 12, wherein obtaining the threshold voltage of the memory cell includes, as the first processing, obtaining a threshold voltage corresponding to a tangent that maximizes an inclination of a waveform of the read characteristic.

16. The test method according to claim 12, wherein obtaining the threshold voltage of the memory cell includes, as the first processing, using a third read characteristic and a fourth read characteristic obtained by non-logarithmically-converting the cell current in each of a first read characteristic and a second read characteristic to parallel-translate a duplication of a waveform of the third read characteristic in a read voltage direction to fit the duplication of the waveform of the third read characteristic to a waveform of the fourth read characteristic, logarithmically-converting the cell current in the fitted third read characteristic to obtain a waveform of a fifth read characteristic, and using the waveform of the fifth read characteristic to obtain a threshold voltage corresponding to the second read characteristic.

17. The test method according to claim 12, wherein the first slope degradation component indicates degradation related to carrier capture efficiency of the memory cell.

18. The test method according to claim 12, further comprising:

acquiring a read characteristic indicating a relationship between a read voltage of the memory cell and a logarithm of a cell current, the memory cell being subject to erase processing in which an erase operation and a verification operation are repeated with an increasing erase voltage;

performing the first processing on the read characteristic to obtain a threshold voltage of the memory cell;

calculating a third slope in a third threshold characteristic indicating a relationship between an erase voltage and a threshold voltage in the erase processing, based on the threshold voltage obtained in the first processing; and subtracting the third slope from the slope in the predetermined threshold characteristic to obtain a third slope degradation component.

19. The test method according to claim 18, further comprising:

obtaining the threshold voltage of the memory cell by performing second processing on the read characteristic, the second processing being processing of focusing on the first region in the read characteristic;

calculating a fourth slope in a fourth threshold characteristic indicating a relationship between an erase voltage and a threshold voltage in the erase processing, based on the threshold voltage obtained in the second processing; and subtracting the fourth slope from the third slope to obtain a fourth slope degradation component.

20. The test method according to claim 19, wherein the predetermined threshold characteristic is a threshold characteristic obtained based on an ideal condition.

21. The test method according to claim 12, wherein the predetermined threshold characteristic is a threshold characteristic obtained based on an ideal condition.

22. A test apparatus comprising:

an interface unit that acquires a read characteristic indicating a relationship between a read voltage of a memory cell and a logarithm of a cell current, the memory cell being subject to write processing in which a write operation and a verification operation are repeated with increasing write voltage; and a controller that obtains a threshold voltage of the memory cell by performing first processing on the read characteristic, the first processing being processing of, when a subthreshold region in the read characteristic is defined as a first region, focusing on a second region being a region of a read voltage larger than a maximum read voltage of the first region, calculates a first slope in a first threshold characteristic indicating a relationship between a write voltage and the threshold voltage in the write processing, based on the threshold voltage obtained in the first processing, and subtracts the first slope from a slope in a predetermined threshold characteristic to obtain a first slope degradation component, the controller, as the first processing, obtaining a threshold voltage corresponding to a tangent that maximizes an inclination of a waveform of the read characteristic.

* * * * *